US009209220B2

(12) United States Patent
Kobayashi et al.

(10) Patent No.: US 9,209,220 B2
(45) Date of Patent: Dec. 8, 2015

(54) SOLID-STATE IMAGING APPARATUS AND MANUFACTURING METHOD OF SOLID-STATE IMAGING APPARATUS

(71) Applicant: CANON KABUSHIKI KAISHA, Tokyo (JP)

(72) Inventors: Masahiro Kobayashi, Tokyo (JP); Mineo Shimotsusa, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/577,985

(22) Filed: Dec. 19, 2014

(65) Prior Publication Data

US 2015/0118782 A1    Apr. 30, 2015

Related U.S. Application Data

(62) Division of application No. 13/807,107, filed as application No. PCT/JP2011/003566 on Jun. 22, 2011, now Pat. No. 8,947,566.

(30) Foreign Application Priority Data

Jun. 30, 2010   (JP) .................................. 2010-149483
May 10, 2011   (JP) .................................. 2011-105415

(51) Int. Cl.
*H01L 27/146*   (2006.01)
*H01L 31/062*   (2012.01)
(Continued)

(52) U.S. Cl.
CPC ........ *H01L 27/1469* (2013.01); *H01L 27/1464* (2013.01); *H01L 27/14632* (2013.01); *H01L 27/14636* (2013.01); *H01L 27/14685* (2013.01); *H01L 27/14687* (2013.01); *H01L 31/0224* (2013.01); *H01L 31/18* (2013.01); *H01L 27/14645* (2013.01)

(58) Field of Classification Search
CPC ..................... H01L 27/1469; H01L 27/14687; H01L 27/14685; H01L 27/1464; H01L 27/14636; H01L 31/18; H01L 31/0224
USPC .......... 257/292, 431, 432, 435, 447, E27.132, 257/E27.133, E31.097, E31.127, E31.128; 348/294; 438/57, 65, 69, 72
See application file for complete search history.

(56) References Cited

U.S. PATENT DOCUMENTS 8,570,409 B2 * 10/2013 Choi et al. ..................... 348/294
2010/0238331 A1 * 9/2010 Umebayashi et al. ........ 348/294
(Continued)

FOREIGN PATENT DOCUMENTS

JP       03-001538 A    1/1991
JP       2005-209677 A    8/2005
(Continued)

*Primary Examiner* — Dao H Nguyen
(74) *Attorney, Agent, or Firm* — Canon USA, Inc. IP Division

(57) ABSTRACT

The first face of the pad is situated between the front-side face of the second semiconductor substrate and a hypothetical plane including and being parallel to the front-side face, and a second face of the pad that is a face on the opposite side of the first face is situated between the first face and the front-side face of the second semiconductor substrate, and wherein the second face is connected to the wiring structure so that the pad is electrically connected to the circuit arranged in the front-side face of the second semiconductor substrate via the wiring structure.

40 Claims, 10 Drawing Sheets

(51) Int. Cl.
    *H01L 31/0224*  (2006.01)
    *H01L 31/18*    (2006.01)

(56) References Cited

U.S. PATENT DOCUMENTS

2011/0102657 A1    5/2011   Takahashi et al.
2015/0031162 A1*   1/2015   Shimotsusa et al. ............ 438/67

FOREIGN PATENT DOCUMENTS

| JP | 2006-019563 A | 1/2006 |
| JP | 2006-191081 A | 7/2006 |
| JP | 2008-172217 A | 7/2008 |
| JP | 2008-536330 A | 9/2008 |
| JP | 2009-277732 A | 11/2009 |

* cited by examiner

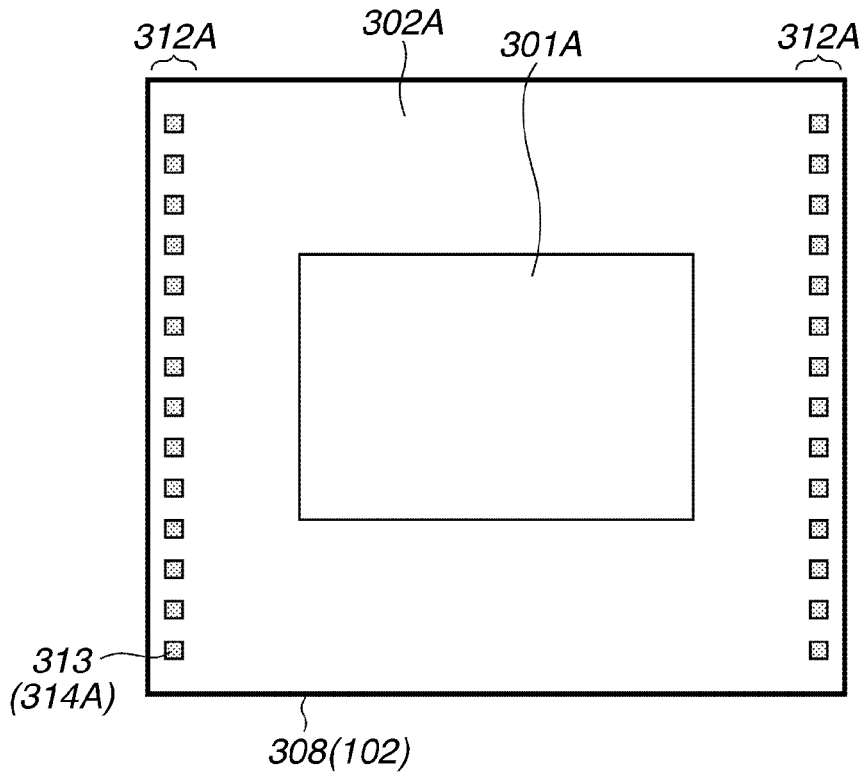
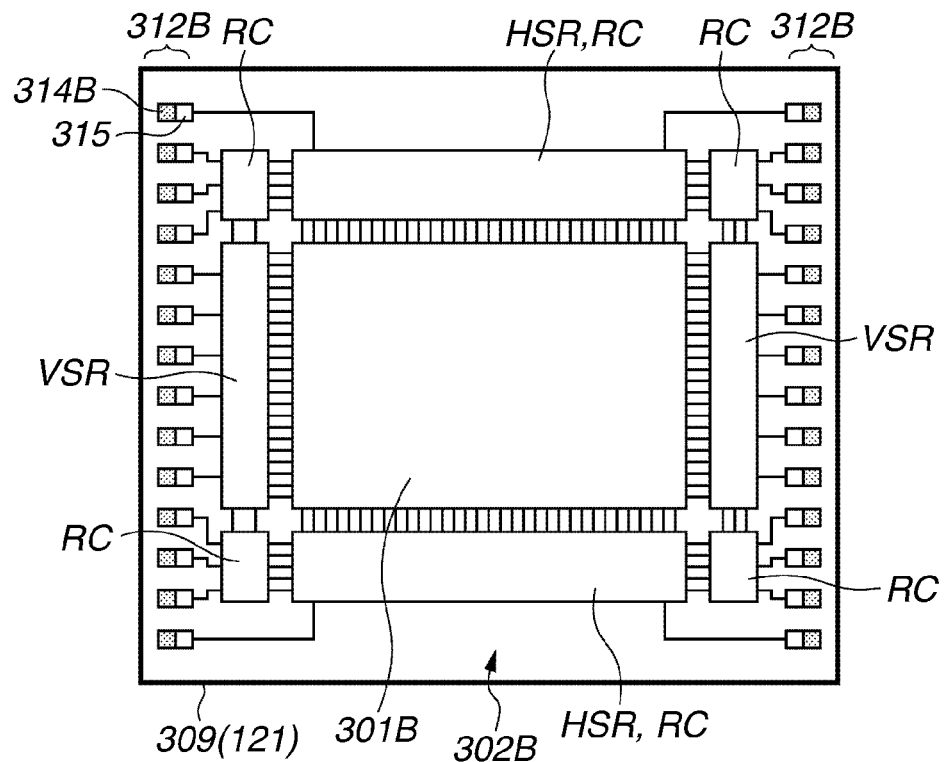

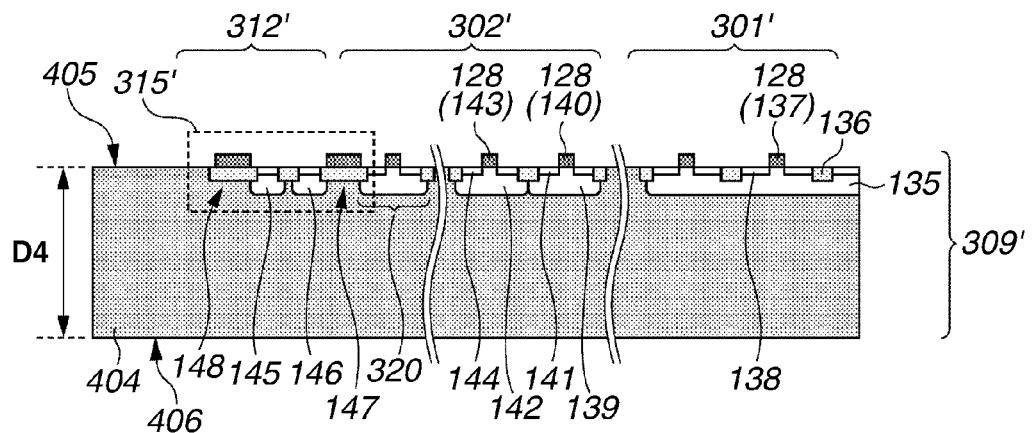
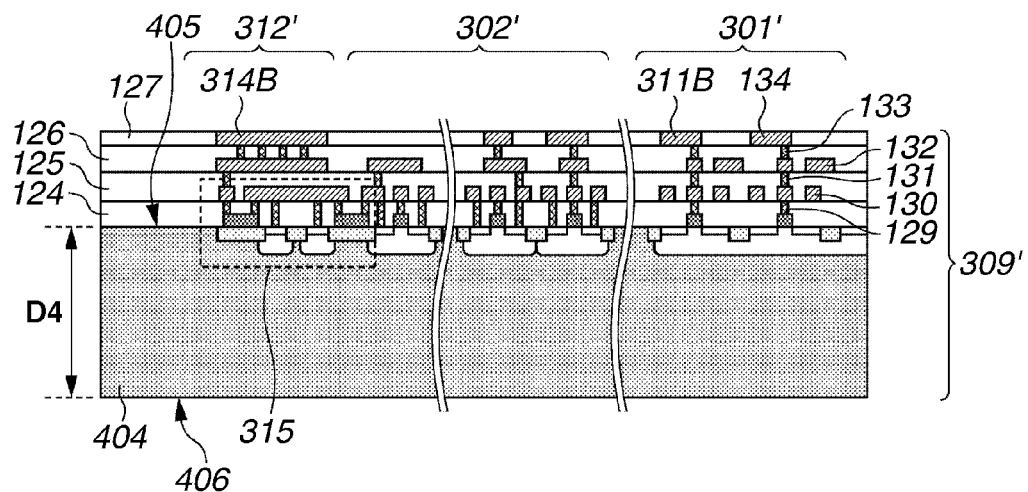

SOLID-STATE IMAGING APPARATUS AND MANUFACTURING METHOD OF SOLID-STATE IMAGING APPARATUS

CROSS-REFERENCE TO RELATED APPLICATION

This application is a Divisional of co-pending U.S. patent application Ser. No. 13/807,107 filed Dec. 27, 2012, which is a National Phase application of International Application PCT/JP2011/003566, filed Jun. 22, 2011, which claims the benefit of Japanese Patent Applications No. 2010-149483 filed Jun. 30, 2010 and No. 2011-105415 filed May 10, 2011, which are hereby incorporated by reference herein in their entirety. The disclosures of the above-named applications are hereby incorporated by reference herein in their entirety.

TECHNICAL FIELD

The present invention relates to a solid-state imaging apparatus and, in particular, to a pad part thereof.

BACKGROUND ART

In a charge-coupled device (CCD) type or an amplification type solid-state imaging apparatus used in a digital still camera, a cam coder, etc, there is a demand for making pixels fine to obtain high definition images. However, the finer the pixels, the smaller the light receiving area of a photoelectric conversion element for detecting light contained in each pixel, resulting in deterioration in sensitivity.

Japanese Patent Application Laid-Open No. 2006-191081 discusses a complementary metal oxide semiconductor (CMOS) type, i.e., an amplification type, solid-state imaging apparatus in which, to secure the light receiving area for the photoelectric conversion element, a first substrate on which the photoelectric conversion element and a transfer transistor are arranged and a second substrate on which another circuit is arranged are bonded together to form the solid-state imaging apparatus. In the solid-state imaging apparatus as discussed in Japanese Patent Application Laid-Open No. 2006-191081, a connection portion extending through the second substrate is connected with a pad (input/output pad) to establish pad connection from the back-side face side of the second substrate. The pad is formed on the back-side face of the second substrate after exposure of a second connection portion by polishing the second substrate.

Japanese Unexamined Patent Application Publication (Translation of PCT Application) No. 2010-514177 discusses a manufacturing method of an electronic component in which a first substrate equipped with an image sensor and a first conductive area and a second substrate equipped with an integrated circuit and a second conductive area are bonded to each other. After the bonding of the first substrate and the second substrate, the first conductive area and the second conductive area are exposed, and, further, a conductive layer is stacked thereon to form electrical connection between the first conductive area and the second conductive area. The first conductive area or the conductive layer is used as the pad (external connection pad).

CITATION LIST

Patent Literature

[PTL 1]
Japanese Patent Application Laid-Open No. 2006-191081
[PTL 2]
Japanese Unexamined Patent Application Publication (Translation of PCT Application) No. 2010-514177

SUMMARY OF INVENTION

Technical Problem

In the configuration as discussed in Japanese Patent Application Laid-Open No. 2006-191081, an electrical route connecting the pad and the first substrate is rather long. Accordingly, performance may be degraded due to increase in connection resistance, and the reliability of the connection between the pad and the first substrate may be decreased. In the configuration as discussed in Japanese Unexamined Patent Application Publication (Translation of PCT Application) No. 2010-514177, the reliability in the connection between the pad and the second conductive area may be decreased.

In the manufacturing method as discussed in Japanese Patent Application Laid-Open No. 2006-191081, it is necessary to provide the steps of providing a liner for separating the connection portion and the second substrate from each other, polishing the second substrate, and forming an input/output pad, resulting in a rather complicated process. In the manufacturing method as discussed in Japanese Unexamined Patent Application Publication (Translation of PCT Application) No. 2010-514177, it is necessary to provide the step of providing openings of different depths for the first conductive area and the second conductive area, resulting in a rather complicated process.

The present invention relates to a solid-state imaging apparatus of high reliability for the connection between the pad and the circuit. Further, the present invention relates to a manufacturing method of the solid-state imaging apparatus which can easily form the connection between the pad and the circuit.

Solution to Problem

According to a first aspect of the present invention, there is provided a solid-state imaging apparatus comprising a first semiconductor substrate including a photoelectric conversion element, a second semiconductor substrate including at least a part of a circuit arranged in a front-side face of the second semiconductor substrate, the circuit generating a signal based on a charge of the photoelectric conversion element, wherein a front-side face of the first semiconductor substrate and the front-side face of the second semiconductor substrate face to each other, a wiring structure arranged between the first semiconductor substrate and the second semiconductor substrate, and a pad having a first face to which an external terminal is to be connected, wherein the first face of the pad is situated between the front-side face of the second semiconductor substrate and a hypothetical plane including and being parallel to the front-side face, and a second face of the pad that is a face on the opposite side of the first face is situated between the first face and the front-side face of the second semiconductor substrate, and wherein the second face is connected to the wiring structure so that the pad is electrically connected to the circuit arranged in the front-side face of the second semiconductor substrate via the wiring structure.

According to a second aspect of the present invention, there is provided a solid-state imaging apparatus comprising a first semiconductor substrate including a photoelectric conversion element and including a certain part of a circuit arranged in a front-side face of the first semiconductor substrate, the circuit generating a signal based on a charge of the photoelectric conversion element, a second semiconductor substrate including another part of the circuit arranged in a front-side face of the second semiconductor substrate, wherein the front-side face of the first semiconductor substrate and the front-side face of the second semiconductor substrate face to each other, a wiring structure arranged between the first semiconductor substrate and the second semiconductor substrate, and a pad having a first face to which an external terminal is to be connected, wherein the first face of the pad is situated between the front-side face of the first semiconductor substrate and a hypothetical plane including and being parallel to the front-side face, and a second face of the pad that is a face on the opposite side of the first face is situated between the first face and the front-side face of the first semiconductor substrate, and wherein the second face is connected to the wiring structure so that the pad is electrically connected to the certain part of the circuit via the wiring structure and the certain part of the circuit is connected to the another part of the circuit via the wiring structure.

According to yet another aspect of the present invention, there is provided a manufacturing method of a solid-state imaging apparatus comprising a step for bonding a first member having a first semiconductor substrate including a photoelectric conversion element and having a first wiring structure arranged on the front-side face of the first semiconductor substrate and a second member having a second semiconductor substrate including at least a part of a circuit arranged in a front-side face of the second semiconductor substrate, the circuit generating a signal based on a charge of the photoelectric conversion element and having a second wiring structure arranged on the front-side face of the second semiconductor substrate, wherein the first member and the second member are bonded so as to connect the first wiring structure and the second wiring structure to each other, and a step for thinning the first semiconductor substrate from a back-side face side of the first semiconductor substrate after the bonding step, wherein, prior to the bonding step, a pad to be connected to an external terminal is connected to the first wiring structure or the second wiring structure, and, after the thinning step, a step for exposing the pad on the first semiconductor substrate side is conducted.

Advantageous Effects of Invention

According to the present invention, it is possible to provide a solid-state imaging apparatus of high reliability in terms of the connection between the pad and the circuit. Further, according the present invention, the connection between the pad and the circuit can be easily formed.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

FIG. 2A is a schematic plan view of the solid-state imaging apparatus of the first exemplary embodiment.

FIG. 2B is a schematic plan view of the solid-state imaging apparatus of the first exemplary embodiment.

FIG. 5A is a schematic sectional view illustrating a manufacturing method of the solid-state imaging apparatus according to the first exemplary embodiment.

FIG. 5B is a schematic sectional view illustrating a manufacturing method of the solid-state imaging apparatus according to the first exemplary embodiment.

DESCRIPTION OF EMBODIMENTS

Figure 1:
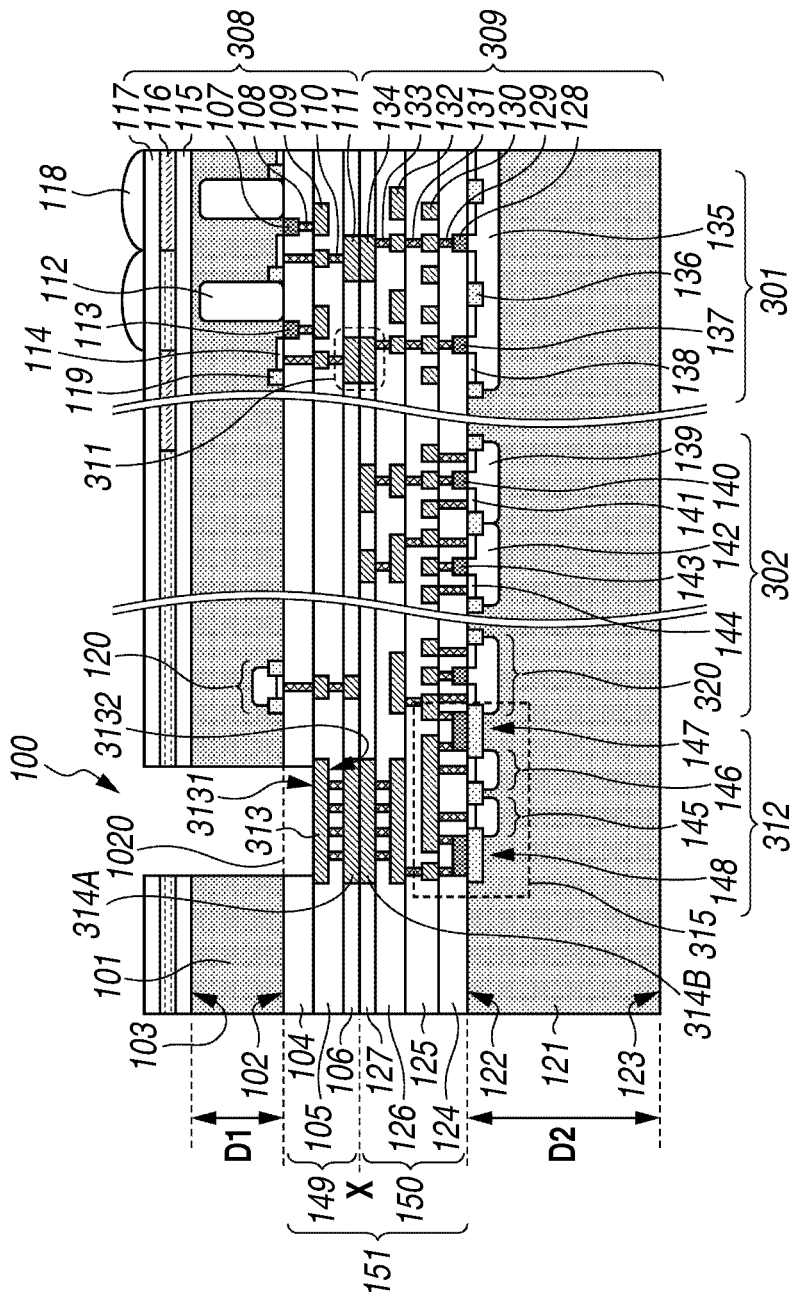
FIG. 1 is a schematic sectional view of a solid-state imaging apparatus according to a first exemplary embodiment.

Various exemplary embodiments, features, and aspects of the invention will be described in detail below with reference to the drawings.

A solid-state imaging apparatus according to the present invention comprises a first semiconductor substrate including a photoelectric conversion element, and a second semiconductor substrate including at least apart of a circuit for generating a signal based on the charge of the photoelectric conversion element. The circuit is arranged in a front-side face of the second semiconductor substrate. A front-side face of the first semiconductor substrate and the front-side face of the second semiconductor substrate are arranged so as to face each other. A wiring structure is arranged between the first semiconductor substrate and the second semiconductor substrate. The solid-state imaging apparatus comprises a pad to which an external terminal is connected, and the external terminal is to be connected to a first face of the pad.

In a first solid-state imaging apparatus, a first face of the pad is situated between a hypothetical plane and the front-side face of the second semiconductor substrate. The hypothetical plane includes the front-side face of the first semiconductor substrate and parallel to the front-side face. A second face of the pad which is a face on the opposite side of the first face is situated between the first face and the front-side face of the second semiconductor substrate. The second face of the pad is connected to the wiring structure so that the pad is electrically connected to the circuit arranged in the front-side face of the second semiconductor substrate via the wiring structure.

In a second solid-state imaging apparatus, a part of a circuit is arranged on the first semiconductor substrate. The first face of the pad is situated between the front-side face of the first semiconductor substrate and a hypothetical plane. The hypothetical plane includes the front-side face of the second semiconductor substrate and parallel to the front-side face thereof. The second face of the pad which is a face on the opposite side of the first face is situated between the first face and the front-side face of the first semiconductor substrate. The second face of the pad is connected to the wiring structure so that the pad may be connected to a part of a circuit arranged on the first semiconductor substrate via the wiring structure. The part of the circuit arranged on the first semiconductor substrate is electrically connected to the part of the circuit arranged on the second semiconductor substrate via the wiring structure. Such configuration allows providing a solid-state imaging apparatus of high reliability in terms of the connection between the pad and the circuit.

The manufacturing method of the solid-state imaging apparatus according to the present invention includes the step of bonding a first member and a second member to each other. The first member includes the first semiconductor substrate on whose front-side face the photoelectric conversion element is arranged, and a first wiring structure arranged on the front-side face of the first semiconductor substrate. The second member includes the second semiconductor substrate on whose front-side face there is arranged at least a part of the circuit for generating a signal based on the charge of the photoelectric conversion element and a second wiring structure arranged on the front-side face of the second semiconductor substrate.

The bonding step is conducted so as to connect the first wiring structure and the second wiring structure to each other. After the bonding step, there is provided the step of thinning the first semiconductor substrate from the back-side face side of the first semiconductor substrate. Prior to the bonding step, a pad to be connected to an external terminal is connected to the first wiring structure or the second wiring structure, and, after the thinning step, the step of exposing the pad on the first semiconductor substrate side is conducted. Such manufacturing method can facilitate the formation of the connection between the pad and the circuit.

In the following, the present invention will be described in detail with reference to the drawings. Regarding the first solid-state imaging apparatus described above, a description will be given in connection with first to third exemplary embodiments, and, regarding the second solid-state imaging apparatus, a description will be given in connection with a fourth exemplary embodiment. In the description of the exemplary embodiments, the main face of the first substrate and the main face of the second substrate refer to the front-side faces of the substrates. Regarding the substrates, the faces on the opposite side of the main faces (front-side faces) are the back-side face of the first substrate and the back-side face of the second substrate. In each substrate, the upward direction refers to the direction from the back-side face toward the main face (front-side face), and the downward direction and the depth direction refer to the direction from the main face (front-side face) of the substrate toward the back-side face thereof. In the solid-state imaging apparatus, the first substrate is arranged on the second substrate in conformity with the direction as indicated in the drawings, and in some cases, the upward direction is from the second substrate toward the first substrate, and the downward direction is from the first substrate toward the second substrate.

The first exemplary embodiment of the present invention will be described with reference to FIGS. 1 through 6.

Figure 3:
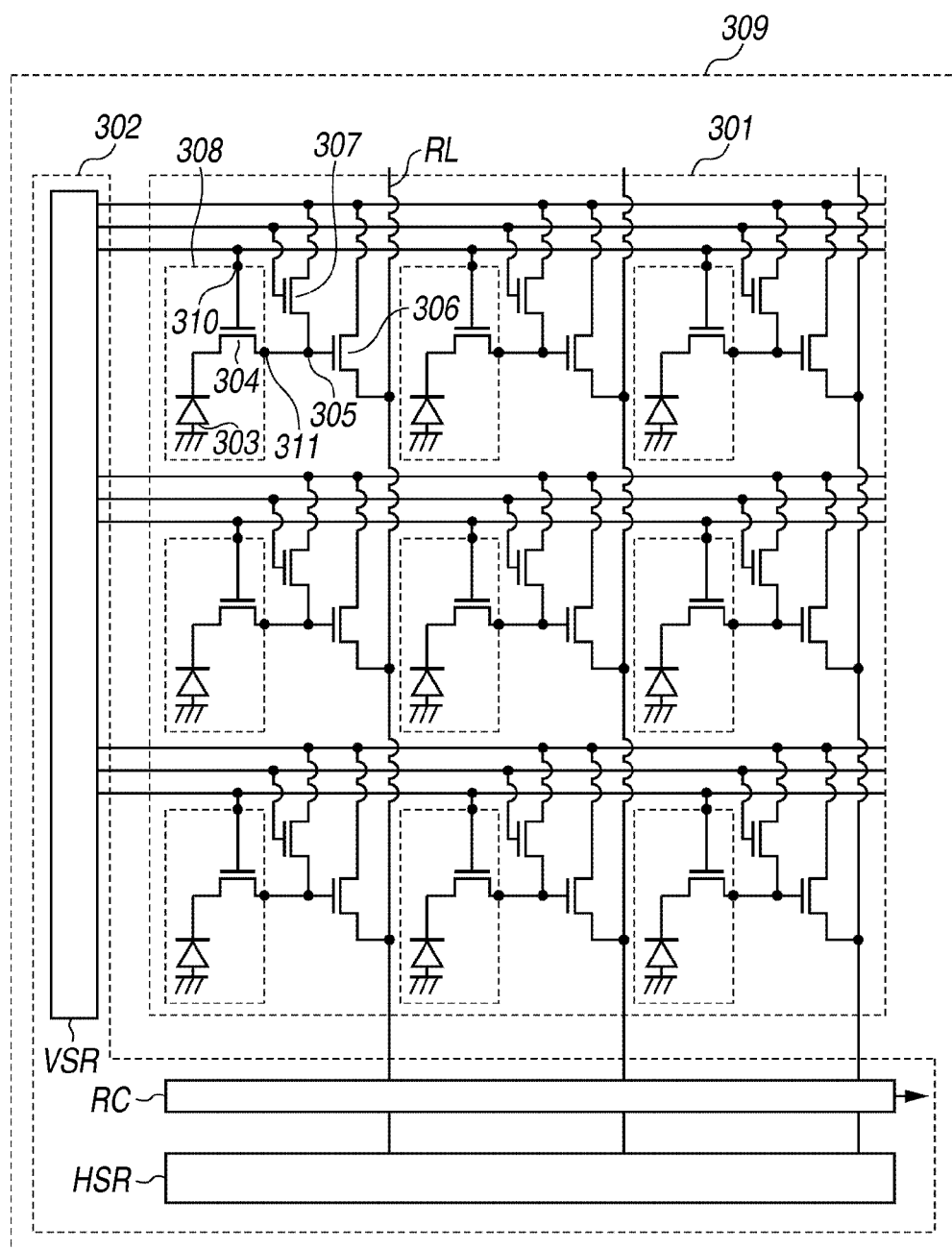
FIG. 3 is a circuit diagram of the solid-state imaging apparatus of the first exemplary embodiment.

First, the circuit of the solid-state imaging apparatus according to the first exemplary embodiment will be described with reference to FIG. 3. In the present exemplary embodiment described below, a signal charge may be, for example, an electron. The solid-state imaging apparatus illustrated in FIG. 3 includes a pixel part 301 in which a plurality of photoelectric conversion elements are arranged. Further, the solid-state imaging apparatus includes a reading circuit configured to read a signal from the pixel part 301, a control circuit for driving the pixel part 301 and the reading circuit, and a peripheral circuit part 302 having a peripheral circuit including a signal processing circuit configured to process read signals.

In the pixel part 301, there are arranged a plurality of photoelectric conversion elements 303, transfer transistors 304, amplification transistors 306, and a reset transistors 307. A structure including at least one photoelectric conversion element 303 will be regarded as a pixel. In the present exemplary embodiment, one pixel includes the photoelectric conversion element 303, the transfer transistor 304, the amplification transistor 306, and the reset transistor 307. The anode of the photoelectric conversion element 303 is grounded. The source of the transfer transistor 304 is connected to the cathode of the photoelectric conversion element 303, and the drain region of the transfer transistor 304 is connected to the gate electrode of the amplification transistor 306.

A node that is identical with the gate electrode of the amplification transistor 306 will be referred to as a node 305. The reset transistor is connected to the node 305, and sets the potential of the node 305 to an arbitrary potential (e.g., reset potential). Here, the amplification transistor 306 is a part of a source follower circuit, and outputs a signal according to the potential of the node 305 to a signal line RL. The node 305 is sometimes referred to as a floating diffusion. A circuit including the transfer transistor 304, the amplification transistor 306, and the reset transistor 307 is a pixel circuit.

The peripheral circuit part 302 represents a region other than the pixel part 301. In the peripheral circuit part 302, a peripheral circuit including a reading circuit and a control circuit is arranged. The peripheral circuit includes a vertical scanning circuit VSR which is a control circuit for supplying a control signal to the gate electrodes of the transistors of the pixel part 301. Further, the peripheral circuit includes a reading circuit RC configured to retain a signal output from the pixel part 301 and to perform signal processing such as amplification, addition, and analog-to-digital (AD) conversion. Furthermore, the peripheral circuit includes a horizontal scanning circuit HSR which is a control circuit configured to control the timing with which signals are successively output from the reading circuit RC.

The solid-state imaging apparatus according to the first exemplary embodiment is formed by bonding two members to each other. The two members may consist of a first member 308 having a first substrate 101 and a second member 309 having a second substrate 121. On the first substrate 101, the photoelectric conversion element 303 and the transfer transistor 304 of the pixel part 301 are provided. On the second substrate 121, the amplification transistor 306 and the reset transistor 307 of the pixel part 301 and the peripheral circuit part 302 are provided.

A control signal is supplied from the peripheral circuit part 302 of the second member 309 to the gate electrode of the transfer transistor 304 of the first member 308 via a connection portion 310. The configuration of the connection portion 310 will be described below. A signal generated by the photoelectric conversion element 303 of the first member 308 is read at the drain region of the transfer transistor 304, that is, the node 305. The node 305 includes a structure arranged on the first member and a structure arranged on the second member 309.

Providing such configuration, as compared with the conventional structure in which the entire pixel part is arranged on one member (i.e., one substrate), makes it possible to enlarge the area of the photoelectric conversion element 303, so that a sensitivity can be improved. Further, as compared with the conventional structure in which the entire pixel part is arranged on one member (i.e., one substrate), it is possible to provide more photoelectric conversion elements 303 if the area of the photoelectric conversion elements is the same, thus the number of pixels can be increased. It is only necessary for at least the photoelectric conversion elements to be arranged on the first substrate, and the amplification transistors 306 may be arranged on the first substrate. Further, it is also possible to adopt a configuration in which the photoelectric conversion elements and the gate electrodes of the amplification transistors are connected to each other without providing the transfer transistors. In the present invention, the elements arranged on the first substrate can be arbitrary selected, and the configuration of the pixel circuit can be arbitrary selected.

The plan layout of such solid-state imaging apparatus will be specifically described with reference to FIGS. 2A and 2B, which are schematic plan views of the solid-state imaging apparatus. FIG. 2A illustrates the plan layout on the first member 308, that is, the first substrate (101). FIG. 2B illustrates the plan layout of the second member 309, that is, the second substrate (121).

In FIG. 2A, arranged on the first member 308 are a pixel part 301A where a plurality of photoelectric conversion elements are arranged and pad parts 312A where pads 313 are arranged. On the pixel part 301A, a plurality of photoelectric conversion elements 303, transfer transistors 304, and connection portions 310 and 311 as illustrated in FIG. 3 are arranged. In the pad part 312A, connection portions 314A for connecting the second member 309 are arranged on the same positions as those of the pads 313 in the plane.

An external terminal is connected to the pad 313. An example of the external terminal is a bonding wire connected to the pad 313 by the wire bonding method. A plurality of pads 313 are arranged in the solid-state imaging apparatus, and the pads 313 include a pad (output pad) for outputting a signal (image signal) based on a charge generated by the photoelectric conversion element, and a pad (input pad) to which a voltage supplied from the exterior to drive the peripheral circuit is input.

In FIG. 2B, a pixel part 301B, a peripheral circuit portion 302B, and pad parts 312B are arranged on the second member 309. A part of the pixel circuit is arranged in the pixel part 301B, and a plurality of amplification transistors 306, reset transistors 307, and connection portions 310 and 311 as illustrated in FIG. 3 are arranged therein. A part of the peripheral circuit is arranged in the peripheral circuit part 302B, and a horizontal scanning circuit HSR, a vertical scanning circuit VSR, and a reading circuit RC are arranged.

The pad parts 312B include protective diode circuits 315. Connection portions 314B for connection with the first member 308 are arranged in the pad parts 312B on the same positions as those of the protective diode circuits 315 in the plane. The protective diode circuits 315 and the connection portions 314B are not necessarily arranged on the same positions in the plane. The protective diode circuits 315 are connected to peripheral circuits. More specifically, as illustrated in FIG. 2B, a plurality of protective diode circuits 315 are provided, and each of the protective diode circuits 315 connected to the pads 313 is connected to the vertical scanning circuit VSR, the horizontal scanning circuit HSE, or the reading circuit RC.

As described above, the second substrate 121 is provided with the pixel circuit arranged in the pixel part 301, the peripheral circuit arranged in the peripheral circuit part 302, and the protective diode circuits arranged in the pad parts 312B. These circuits are semiconductor integrated circuits, and may be formed by a large number of semiconductor elements including transistors, diodes, resistor elements, capacitance elements, etc. By operating the integrated circuits formed by semiconductor elements, a signal based on the charge (signal charge) of the photoelectric conversion elements 303 is generated.

The first member 308 and the second member 309 of the plan layout as illustrated in FIGS. 2A and 2B are bonded to each other to form the solid-state imaging apparatus of the present exemplary embodiment. More specifically, the pixel part 301A and the pixel part 301B are arranged so as to overlap with each other. In addition, the connection portion 314A and the connection portion 314B are connected to each other, and the connection portions 310 and 311 of the first member are connected to the connection portions 310 and 311 of the second member respectively. In FIGS. 2A and 2B, the region of the first member 308 corresponding to the peripheral circuit part 302B of the second member 309 is shown as the peripheral circuit part 302A. Apart of the scanning circuit, that is, a part of the peripheral circuit, may be arranged in the peripheral circuit part 302A.

Next, the schematic sectional views of the solid-state imaging apparatus illustrated in FIGS. 2A, 2B, and 3 will be described with reference to FIG. 1. In FIG. 1, the components that are the same as those in FIGS. 2A, 2B, and 3 are indicated by the same reference numerals, and a description thereof will be omitted.

The first member 308 includes a first wiring structure 149 and a first substrate 101. The first substrate 101 is, for example, a silicon semiconductor substrate, and has amain face 102 and a back-side face 103. A transistor is arranged in the main face 102 of the first substrate. The first wiring structure 149 includes interlayer insulation films 104 through 106, a gate electrode layer 107 including a gate electrode and wiring, wiring layers 109 and 111 including a plurality of wirings, and contact layers 108 and 110 including a plurality of contacts or vias. The number of layers of the interlayer insulation films, the wiring layers, and the contact layers included in the first wiring structure 149 can be set arbitrarily. In the present exemplary embodiment, the number of layers of the wiring layers is two. The wiring layer 111 of the first wiring structure 149 includes connection portions.

In the pixel part 301 of the first member 308, an n-type semiconductor region 112 constituting a photoelectric conversion element, an n-type semiconductor region 114 that is the drain of a transfer transistor, and an element separation structure 119 are arranged on the first substrate 101. The transfer transistor is formed by the n-type semiconductor region 112, the n-type semiconductor region 114, and a gate electrode 113 included in the gate electrode layer 107. The charge accumulated in the n-type semiconductor region 112 is transferred to the n-type semiconductor region 114 by the gate electrode 113.

The potential based on the charge transferred to the n-type semiconductor region 114 is transmitted to the second member 309 via the contact of the contact layer 108, the wiring of the wiring layer 109, the via of the contact layer 110, and the wiring of the wiring layer 111. The wiring of the wiring layer 111 constitutes the connection portion 311. Further, the photoelectric conversion element may be an embedded photodiode including a p-type semiconductor region, or a photo gate, and can be modified as appropriate.

On the back-side face 103 of the first substrate 101 of the pixel part 301, a planarization layer 115, a color filter layer 116 including a plurality of color filters, a planarization layer 117, and a micro lens layer 118 including a plurality of micro lenses are arranged in this order. In FIG. 1, each of the plurality of color filters and each of the plurality of micro lenses is arranged in correspondence with one photoelectric conversion element, that is, for each pixel. However, each of them may be provided for a plurality of pixels. The solid-state imaging apparatus according to the present exemplary embodiment is a back-side face illumination type solid-state imaging apparatus in which light enters from the micro lens layer 118 side and is received by the photoelectric conversion element through the back-side face 103 of the first substrate 101.

The pad part 312 of the first member 308 includes the pad 313 and an opening 100 through which the pad 313 is exposed for connection to the external terminal. In the present exemplary embodiment, the pad 313 is used as the input pad by way of example. The pad 313 is a conductive film, and includes a first face 3131 and a second face 3132 that is a face on the opposite side of the first face. The first face 3131 of the pad 313 is exposed on the first substrate 101 side, and the external terminal is to be connected to the first face 3131. Further, a connection portion 314A for conducting the voltage input from the pad 313 to the second member 309 is arranged. The connection portion 314A is arranged on the same position as that of the pad 313 in the plane. As illustrated in FIG. 1, an arbitrary circuit element 120 is provided in the region of the first member 308 corresponding to the peripheral circuit part 302 of the second member 309.

The second member 309 includes a second wiring structure 150 and a second substrate 121. The second substrate 121 is, for example, a silicon semiconductor substrate, and has a main face 122 (a front-side face) and a back-side face 123. A transistor is arranged on the main face 122 of the second substrate 121. The second wiring structure 150 includes interlayer insulation films 124 through 127, a gate electrode layer 128 including a gate electrode and wiring, wiring layers 130, 132, and 134 including a plurality of wirings, and contact layers 129, 131, and 133 including a plurality contacts or vias. The number of layers of the interlayer insulation films, the wiring layers, and the contact layers included in the second wiring structure 150 can be set arbitrarily. In the present exemplary embodiment, the number of wiring layers of the second wiring structure 150 is three, which means the wiring structure 150 includes more wiring layers than the first wiring structure 149. The wiring layer 134 includes a connection portion.

In the pixel part 301 of the second member 309, a well 135 constituting an amplification transistor of the pixel circuit, an n-type semiconductor region 138 constituting the source/drain region of the amplification transistor, and an element separation structure 136 are arranged on the second substrate 121. The amplification transistor is constructed by a gate electrode 137 arranged in the well 135 and included in the gate electrode layer 128, and the n-type semiconductor region 138 constituting the source/drain region.

The connection portion 311 of the first member 308 and the gate electrode 137 of the amplification transistor are connected to each other via the wiring of the wiring layer 134, the via of the contact layer 133, the wiring of the wiring layer 132, the via of the contact layer 131, the wiring of the wiring layer 130, and the contact of the contact layer 129. The node 305 in FIG. 3 is constructed by the n-type semiconductor region 114 in FIG. 1, the wirings of the wiring layers 109, 111, 134, 132, and 130, the contacts or vias of the contact layers 108, 110, 133, 131, and 129, and the gate electrode 137. Other circuits of the pixel part 301 (e.g., a reset transistor) is not illustrated.

Next, in the peripheral circuit part 302 of the second member 309, at least a part of the peripheral circuit including control circuits such as a horizontal scanning circuit and a vertical scanning circuit and a reading circuit is arranged. FIG. 1 illustrates the n-type transistor and the p-type transistor of an arbitrary circuit included in the peripheral circuit. An n-type transistor including a gate electrode 140 included in the gate electrode layer 128 and an n-type source/drain region 141 is arranged in a p-type well 139. Further, a p-type transistor including a gate electrode 143 included in the gate electrode layer 128 and a p-type semiconductor region 144 constituting a p-type source/drain region is arranged in an n-type well 142.

In the pad part 312 of the second member 309, there are arranged a protective diode circuit 315 for inputting a signal from the pad 313 of the first member 308, and a connection portion 314B for connecting the first member 308. The connection portion 314B is arranged on the same position as that of the protective diode circuit 315 in the plane. The protective diode circuit 315 of the present exemplary embodiment includes two diodes 145 and 146 formed by semiconductor regions, and two resistors 147 and 148 formed by the gate electrode layer 128.

The resistor 147 is the input terminal of the protective diode circuit 315, and the resistor 148 is the output terminal of the protective diode. The protective diode circuit 315 is formed as follows. The pad 313 and one end of the resistor 147 are connected to each other, and the other end of the resistor 147 is connected to the anode of the diode 145, the cathode of the diode 146, and one end of the resistor 148 via the wiring layer 130. Further, the other end of the resistor 148 is connected to the circuit element 320 of the peripheral circuit part 302 (e.g., the vertical scanning circuit VSR and the horizontal scanning circuit HSR) on the subsequent part.

More specifically, at the node represented by the wiring layer 130, the other end of the resistor 147, the anode of the diode 145, the cathode of the diode 146, and one end of resistor 148 are connected. The cathode of the diode 145 is connected to a predetermined voltage VDD by wiring (not illustrated), and the anode of the diode 146 is connected to a voltage VSS different from the predetermined voltage by wiring (not illustrated). Here, the above-described voltages are in the following relationship, VDD>input voltage>VSS. It is only necessary for the voltage VSS to be lower than the voltage VSS, and it may be a reference voltage GND.

Due to the provision of such protective diode circuit, when, for example, a voltage larger than the sum total of the VDD and a forward voltage drop in the diode 145 is input to the pad 313, a forward bias is applied to the diode 145, and an electric current flows from the node to the VDD. Thus, it is possible to prevent application to the circuit on the subsequent part a voltage larger than the sum total of the VDD and the forward voltage drop in the diode 145.

When a voltage smaller than the difference between the VSS and the forward voltage in the diode 146 is input to the pad, a forward bias is applied to the diode 146, and an electric current flows from the VSS to the node. Thus, it is possible to prevent application to the circuit on the subsequent part of a voltage smaller than the difference between the VSS and the forward voltage at the second diode 146. The resistors 147 and 148 have a function of lowering the input voltage, and reducing the absolute value of the voltage to be applied to the circuit on the subsequent part.

The protective diode circuit 315 of the present exemplary embodiment is merely an example. The present invention is not limited to the present exemplary embodiment, and a protective diode circuit with a configuration for general use is applicable. For example, while the above protective diode circuit 315 is effective in the case where the input voltage satisfies the relationship VDD>input voltage>VSS, it is also possible to provide the protective diode circuit, as needed, corresponding to the relationship, VDD<input voltage, or the relationship, input voltage<VSS. In this case, the number of diodes used in the protective diode circuit may be one.

While in the above example an input pad is discussed, the protection diode circuit 315 may also be connected to an output pad. In this case, it is possible to use the resistor 148 as the input terminal of the protection diode circuit 315, and to use the resistor 147 as the output terminal of the protective circuit 315, and the other end of the resistor 148 can be connected to the circuit element 320 of the peripheral circuit part 302 (e.g., the reading circuit RC) on the input side. It is also possible to arrange a protection diode circuit in the electrical route between the pixel circuit and the pad.

when an abnormal signal is generated within the solid-state imaging device, a protection circuit such as the protection diode circuit 315 connected to the output pad will be able to suppress the output of this abnormal signal to the exterior of the device. As described above, external noise is caused, for example, by erroneous input, voltage surge, etc. In particular, from the viewpoint of protecting the peripheral circuit from voltage surge generated by electro-static discharge (ESD), it is very meaningful to arrange the protection diode circuit 315 on the second substrate 121. The possibility of contamination of voltage surge due to electro-static discharge is high regardless of whether it is an input pad or an output pad, so that it is desirable for the protection diode circuit to be arranged in correspondence with both the input pad and the output pad. Although in the above-described exemplary embodiments a protection diode circuit is adopted as an example of the protection circuit arranged on the second substrate 121 to suppress contamination of external noise, this should not be construed restrictively; the same effect can be attained by using a protection circuit employing a transistor. It is also possible to omit the protection diode circuit 315 and to connect an input pad to the peripheral circuit and the pixel circuit or to connect an output pad to the peripheral circuit. However, from the viewpoint of improvement of electrical reliability, it is desirable to provide a protection diode circuit between the input pad and/or the output pad and the peripheral circuit part 302. It is also possible to provide a protection diode at some midpoint in the electrical route between the pixel circuit and the pad.

In the solid-state imaging apparatus according to the present exemplary embodiment, the main face 102 of the first substrate 101 and the main face 122 of the second substrate 121 are arranged so as to face to each other via the first wiring structure 149 and the second wiring structure 150 (opposing arrangement). More specifically, the first substrate 101, the first wiring structure 149, the second wiring structure 150, and the second substrate 121 are arranged in this order. The upper face of the first wiring structure 149 and the upper face of the second wiring structure 150 are bonded together at a bonding face X. In other words, the first member 308 and the second member 309 are bonded together at the bonding face X.

The bonding face X is formed by the upper face of the first wiring structure 149 and the upper face of the second wiring structure 150. As a result, the first wiring structure 149 and the second wiring structure 150 are integrated and form a wiring structure 151 between the first substrate 101 and the second substrate 121. The wiring structure 151 has five wiring layers 109, 111, 130, 132, and 134. For the bonding of the first wiring structure 149 and the second wiring structure 150, it is possible to employ therebetween a connection member such as a micro bonding, or metal bonding. Such bonding can be achieved by the connection portion 311 and the connection portion 314.

The pad 313 for performing signal exchange with the exterior is arranged in the upper portion of the front-side face of the second substrate 121, which is the main face 122 of the second member 309, and an opening 100 is provided on the first member 308 side.

More specifically, both the first face 3131 and the second face 3132 of the pad 313 are situated on the first substrate 101 side of the main face 122. Here, an expansion of the main face 102 of the first substrate 101 will be considered as a hypothetical plane 1020. The hypothetical plane 1020 is a hypothetical expansion of the main face 102, and it is parallel to the main face 102 and includes the main face 102. Thus, in FIG. 1, the hypothetical plane 1020 extends across the opening 100.

The pad 313 is situated between the main face 122 of the second substrate 121 and the hypothetical plane 1020. More specifically, the first face 3131 of the pad 313 is situated between the hypothetical plane 1020 and the second face 3132, and the second face 3132 of the pad 313 is situated between the first face 3131 and the main face of the second substrate 121. In the present exemplary embodiment, the pad 313 is arranged in the same layer as the wiring layer 109 which is the first layer among the five layers as counted from the hypothetical plane 1020 side.

In this way, the pad 313 is situated between the main face 122 of the second substrate 121 and the hypothetical plane 1020. According to this configuration, the distance between the pad 313 and the second substrate 121 can be less than the distance between the first substrate 101 and the second substrate 121. Thus, the electrical route between the pad 313 and the peripheral circuit can be shortened. As a result, it is possible to reduce delay and loss in signals at the input and/or output terminal.

From the practical point of view, the distance (interval) between the first substrate 101 and the second substrate 121 is not less than 1 micrometer and not more than 10 micrometer. When the distance between the pad 313 and the second substrate 121 is not more than 5 micrometer, the electrical route may be regarded as sufficiently short. A suitable distance (interval) between the pad 313 and the second substrate 121 ranges from 1.5 micrometer through 3.0 micrometer, and in this case, the electrical route from the pad 313 to the protection diode 315 may be several micrometer or less, and, further, on the order of sub microns.

Since there is no need to provide an opening in the second member 309, it is possible to reduce intrusion of water into the peripheral circuit part of the second member 309. In the present exemplary embodiment, the number of elements arranged in the vicinity of the pad part 312A of the first member 308 can be easily made less than the number of elements arranged in the vicinity of the pad part 312B of the second member 309. Further, the element arranged in close proximity to the pad part of the first member 308 can be at a greater distance than the element arranged in close proximity to the pad part of the second member 309. Thus, it is possible to further reduce the influence on the element of the water from the opening 100 for the pad. Further, an external terminal is arranged on the back-side face side of the first member 308, so that connection to the pad 313 can be facilitated, and poor connection can be reduced.

In the pad part 312, the pad 313 is connected to the protection diode circuit 315 via the contact layer 110 and the wiring layer 111 (the connection portion 314A) of the first wiring structure 149, and further via the wiring layer 134 (the connection portion 314B) and the contact layer 133 of the second wiring structure 150, the wiring layer 132, the contact layer 131, the wiring layer 130, the contact layer 129, and the gate electrode layer 128. In this way, the second face 3132 of the pad 313 is connected to the wiring structure 151. According to this configuration, the pad 313 is situated between the main face 122 of the second substrate 121 and the hypothetical plane 1020, and the electrical route is formed from the second face 3132 of the pad 313, so that the electrical route between the pad 313 and the protection diode circuit 315 can be shortened. As a result, it is also possible to shorten the electrical route between the pad 313 and the peripheral circuit.

As described above, in the pad part 312B, the connection portion 314B for connection with the first member is arranged at the same position as the protection diode circuit 315 in the plane. Further, in the pad part 312A, the connection portion 314A for connection with the second member 309 there is arranged at the same position as the pad 313 in the plane. Through the connection of the connection portion 314A and the connection portion 314B, the protection diode circuit 315 and the pad 313 are also arranged at the same position in the plane with each other, so that the protection diode circuit 315 and the pad 313 overlap each other. Thus, the protection diode circuit 315 and the pad 313 can be connected to each other by the shortest possible electrical route.

In the case where the protection diode circuit 315 is omitted, the peripheral circuit part 302 and the circuit element 320 are arranged at positions overlapping the pad 313, and connected with the pad 313 via the wiring structure 151.

In the present exemplary embodiment, the pad 313 is connected to the plurality of vias of the contact layer 133. In this way, the wiring structure 151 and the pad 313, to which an external force likely to be applied, are connected at a plurality of positions, so that the force applied to the wiring structure 151 can be dispersed, and the impact on the second substrate 121 and the wiring structure 151 can be reduced. If the connection to any via is damaged, the possibility that the connection between the pad 313 and the wiring structure 151 is maintained is high, and reliability can be improved.

Figure 4A:
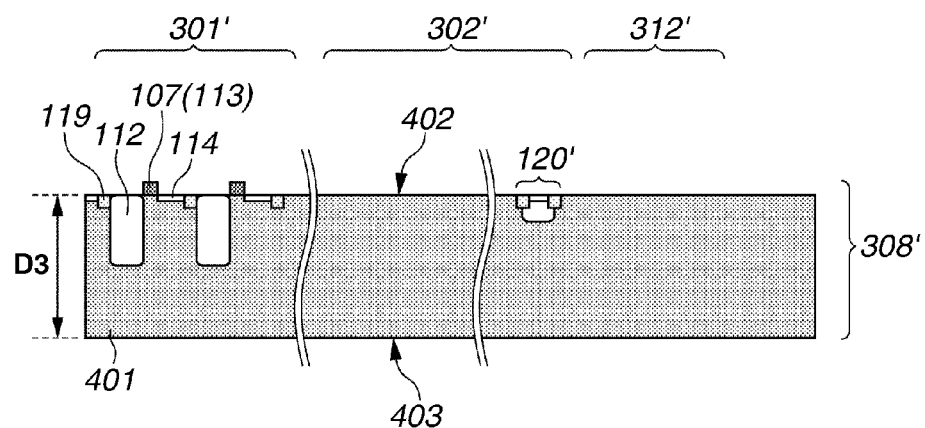
FIG. 4A is a schematic sectional view illustrating a manufacturing method of the solid-state imaging apparatus according to the first exemplary embodiment.
Figure 4B:
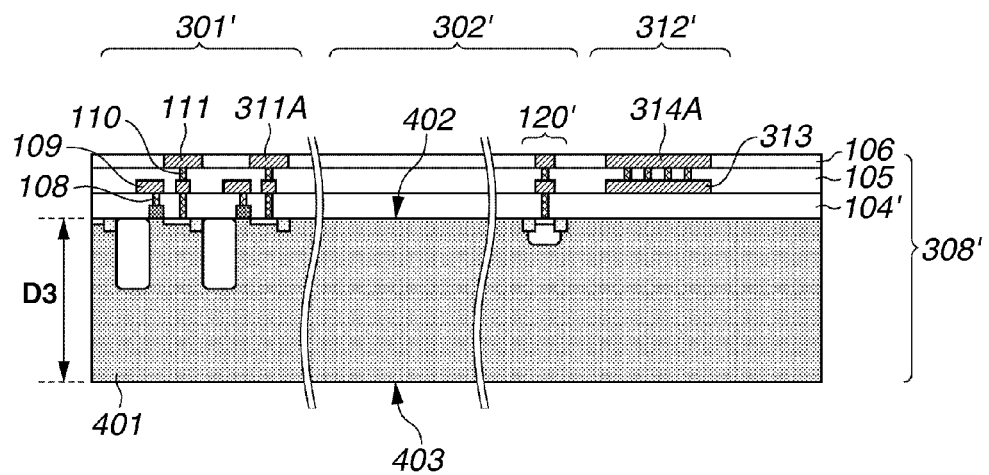
FIG. 4B is a schematic sectional view illustrating a manufacturing method of the solid-state imaging apparatus according to the first exemplary embodiment.
Figure 6A:
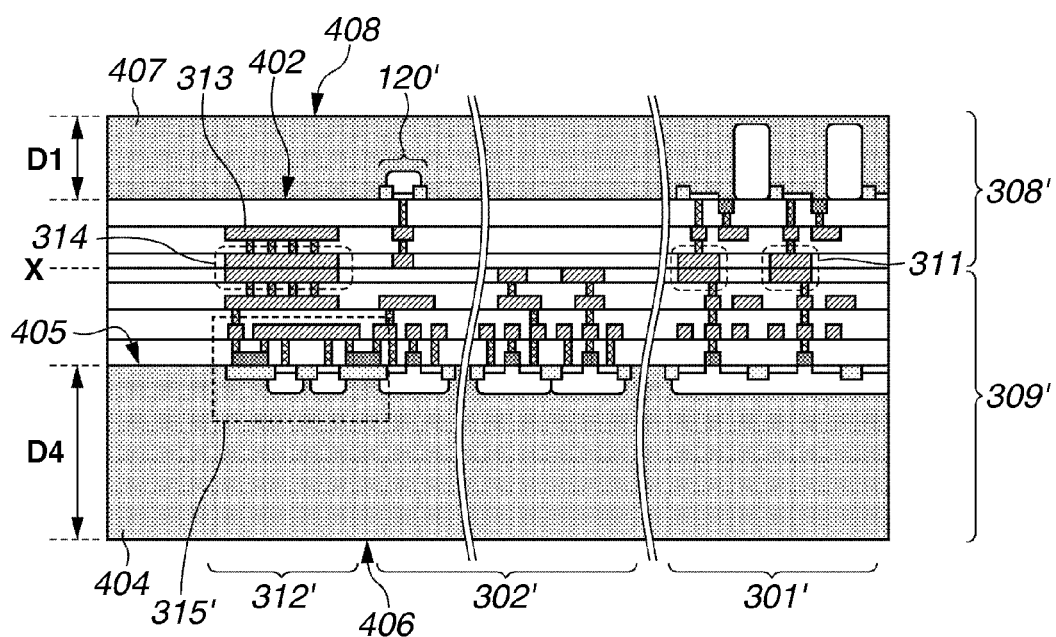
FIG. 6A is a schematic sectional view illustrating a manufacturing method of the solid-state imaging apparatus according to the first exemplary embodiment.
Figure 6B:
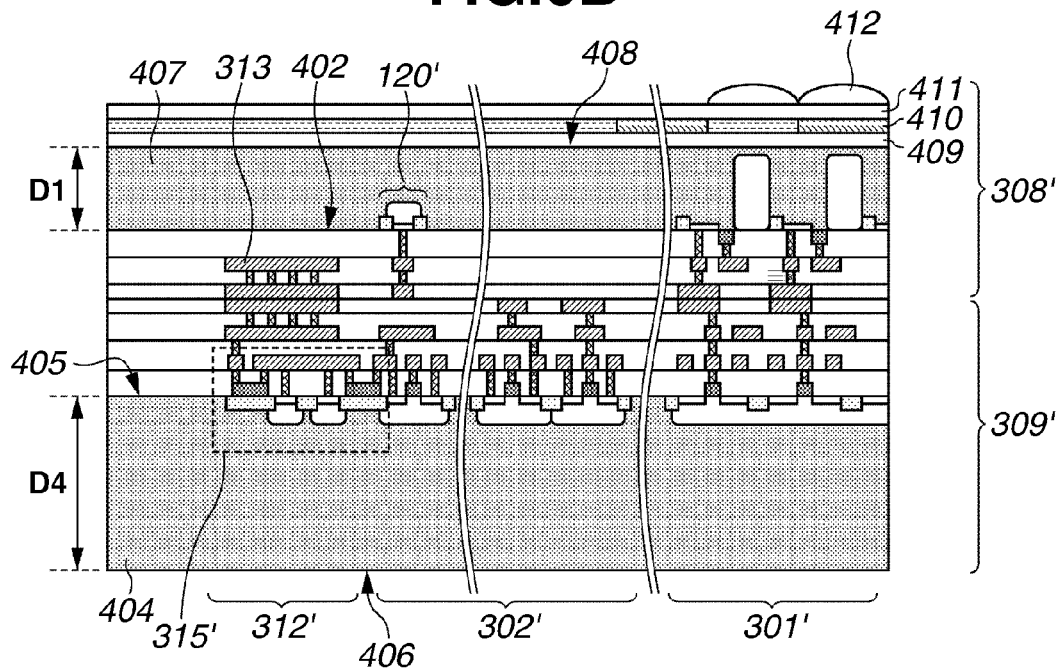
FIG. 6B is a schematic sectional view illustrating a manufacturing method of the solid-state imaging apparatus according to the first exemplary embodiment.

Next, a manufacturing method of the solid-state imaging apparatus according to the present exemplary embodiment will be described with reference to FIGS. 4A and 4B through 6A and 6B. FIGS. 4A and 4B are schematic sectional views illustrating a process for manufacturing the first member 308. FIGS. 5A and 5B are schematic sectional views illustrating a process for manufacturing the second member 309. FIGS. 6A and 6B are schematic sectional views illustrating a manufacturing process after the bonding of the first member 308 and the second member 309.

The process for manufacturing the first member 308 in FIG. 1 will be described with reference to FIG. 4. In FIG. 4, a structure 308' later constitutes the first member 308 in FIG. 1. Further, portions 301', 302', 312', and 120' respectively later constitute the pixel part 301, the peripheral circuit part 302, the pad part 312, and the circuit element 120, which is a part of the peripheral circuit, in FIG. 1.

First, a semiconductor substrate is prepared, and an element is formed in the semiconductor substrate. There is prepared a semiconductor substrate 401 of a thickness D3 having a main face 402 and a back-side face 403. The semiconductor substrate 401, for example, is a silicon semiconductor substrate. An element separation structure 119 is formed on the semiconductor substrate 401. The element separation structure 119 may include an insulation material such as a silicon oxide film, and has, for example, the local oxidation of silicon (LOCOS) structure and the shallow trench isolation (STI) structure. Further, an arbitrary conductive type well (not illustrated) is formed in the semiconductor substrate 401.

Then, the n-type semiconductor regions 112 and 114 forming the photoelectric conversion element and the transistor and the p-type semiconductor region (not illustrated) are formed. Further, the gate electrode layer 107 that includes gate electrode including the gate electrode 113 of the transfer transistor is formed. The gate electrode layer is formed by deposition of a poly silicon layer and patterning, and can include not only the gate electrode but also wiring. The gate electrode, the element separation structure, and the semiconductor regions can be formed by a general semiconductor process, and thus a detailed description of the process will be omitted. By the above process, the structure as illustrated in FIG. 4A is obtained.

Next, a wiring structure is formed on the main face 402 of the semiconductor substrate 401. The wiring structure includes interlayer insulation films 104', 105, and 106, the contact layers 108 and 110, and the wiring layers 109 and 111. Here, the interlayer insulation film 104' later becomes the interlayer insulation film 104 in FIG. 1. The interlayer insulation film 104' covers the gate electrode layer 107, the contact layer 108 is arranged in the interlayer insulation film 104', and the wiring layer 109 and the pad 313 are arranged on the interlayer insulation film 104'.

The interlayer insulation film 105 covers the wiring layer 109, the contact layer 110 is arranged in the interlayer insulation film 105, and the wiring layer 111 is arranged on the interlayer insulation film 105. The interlayer insulation film 106 is arranged on the interlayer insulation film 105 and has an opening through which the wiring of the wiring layer 111 is exposed. The upper face of the wiring structure is formed by the upper face of the interlayer insulation film 106 and the upper face of the wiring layer 111.

The interlayer insulation films are silicon oxide films. However, the interlayer insulation films may also be formed by silicon nitride films, organic resin or the like. The wiring layers include wiring whose main component is aluminum, wiring whose main component is copper, etc. The contacts are formed, for example, of tungsten. The vias can be formed of tungsten or integrally with the wiring whose main component is copper. The wiring layer 111 includes the connection portions 314A and 311A, and is constituted by wiring whose main component is copper. The wiring layer 109 is constituted by wiring whose main component is aluminum.

The pad 313 is arranged in the same layer as the wiring layer 109, and contains aluminum as a main component. Regarding the manufacturing method of the wiring layer, the contact layer, the interlayer insulation film, and the pad 313, they can be formed by a general semiconductor process, and thus a detailed description of the method will be omitted. By the above process, the configuration as illustrated in FIG. 4B is obtained. In FIG. 4B, components 104', 105, 106, and 108 through 111 form the first wiring structure 149 in FIG. 1 later. The connection portion 311A forms the connection portion 311 later. Next, the process for manufacturing the second member 309 in FIG. 1 will be described with reference to FIGS. 5A and 5B. In FIGS. 5A and 5B, a structure 309' later constitutes the second member 309 in FIG. 1. Further, portions 301', 302', 312', and 120' respectively later constitute the pixel part 301, the peripheral circuit part 302, the pad part 312, and the circuit element 120, which is a part of the peripheral circuit, in FIG. 1.

First, a semiconductor substrate is prepared, and an element is formed on the semiconductor substrate. There is prepared a semiconductor substrate 404 of a thickness D4 having a main face 405 and a back-side face 406. An element separation structure 136 is formed on the semiconductor substrate 404 by using the LOCOS or the STI structure. Further, p-type wells 135 and 139 and an n-type well 142 are formed in the semiconductor substrate 404.

Then, n-type semiconductor regions 138 and 141 that can be source/drain regions constituting a transistor, a p-type semiconductor region 144, and a semiconductor region constituting a diode are formed. The gate electrode layer 128 including the gate electrodes 137, 140, and 143 and wiring (resistor) of the transistor is formed through deposition of a poly silicon layer and patterning. The gate electrode, the element separation structure, and the semiconductor regions can be formed by the general semiconductor process, and thus a detailed description of the process will be omitted. By the above process, the configuration as illustrated in FIG. 5A is obtained.

Next, a wiring structure is formed on the main face 405 of the semiconductor substrate 404. The wiring structure includes interlayer insulation films 124 through 127, contact layers 129, 131, and 133, and wiring layers 130, 132, and 134. The interlayer insulation film 124 covers the gate electrode layer 128, the contact layer 129 is arranged in the interlayer insulation film 124, and the wiring layer 130 is arranged on the interlayer insulation film 124.

The interlayer insulation film 125 covers the wiring layer 130, the contact layer 131 is arranged in the interlayer insulation film 125, and the wiring layer 132 is arranged on the interlayer insulation film 125. The interlayer insulation film 126 covers the wiring layer 132, and is arranged on the interlayer insulation film 125. Further, the contact layer 133 is arranged in the interlayer insulation film 126, and the wiring layer 134 is arranged on the interlayer insulation film 126. The interlayer insulation film 127 is arranged on the interlayer insulation film 126 and includes an opening through which the wiring of the wiring layer 134 is exposed. The upper face of the wiring structure is formed by the upper face of the interlayer insulation film 127 and the upper face of the wiring layer 134.

Here, the interlayer insulation films are the silicon oxide films. The interlayer insulation films may also be formed by silicon nitride films, organic resin or the like. The wiring layers include wiring whose main component is aluminum, wiring whose main component is copper, etc. The wiring layer 134 includes the connection portion 314B and 311B, and is constituted by wiring whose main component is copper. Regarding the manufacturing method of the wiring layer, the contact layer, and the interlayer insulation film, they can be formed by a general semiconductor process, and thus a detailed description of the method will be omitted. By the above process, the configuration as illustrated in FIG. 5B is obtained. In FIG. 5B, components 124 through 127, 129 through 134, etc. form the first wiring structure 150 in FIG. 1 later. The connection portion 311B forms the connection portion 311 later.

The first member 308' and the second member 309' illustrated in FIGS. 4B and 5B are bonded to each other such that the main face 402 and the main face 405 of their respective semiconductor substrates face to each other. In other words, the uppermost face of the wiring structure of the first member 308' and the uppermost face of the wiring structure of the second member 309' are bonded to each other. Here, the connection portions 311A and 311B, and the connection portions 314A and 314B are constituted by the wiring whose main component is copper, so that the bonding can be conducted by copper metal bonding.

After the first member 308' and the second member 309' are bonded to each other, the semiconductor substrate 401 is thinned from the back-side face 403 side of the semiconductor substrate 401 of the first member 308' to turn the semiconductor substrate 401 into a thin film. The thin film formation can be effected by chemical mechanical polishing (CMP), etching, or the like. Accordingly, the semiconductor substrate 401 is formed into a semiconductor substrate 407, with its thickness being changed from D3 to D1 (D1<D3) (FIG. 6A). By thus thinning the semiconductor substrate 401 into the semiconductor substrate 407, it is possible for the incident light to efficiently enter the photoelectric conversion element later. At this time, the thickness D1 of the semiconductor substrate 407 is smaller than the thickness D4 of the semiconductor substrate 404.

Next, on the back-side face 408 of the semiconductor substrate 407, there are formed a planarization layer 409 made of resin, a color filter layer 410, a planarization layer 411 made of resin, and a micro lens layer 412 in this order. The planarization layer, the color filter layer, and the micro lens layer can be formed by a general semiconductor process, and thus a detailed description of the process will be omitted. The micro lens layer may be formed up to the region 312' constituting the pad part. By the above process, the configuration as illustrated in FIG. 6B is obtained.

And, the opening 100 for exposing the pad 313 is formed. Here, the photolithography technique is adopted, and a photo resist mask having an arbitrary opening is provided above the micro lens layer 412. Then, by the dry etching technique, the micro lens layer 412, the planarization layer 411, the color filter layer 410, the planarization layer 409, the semiconductor substrate 407, and the interlayer insulation film 104' are removed, and the opening 100 is formed, so that the pad 313 is exposed through the opening 100.

Further, there are formed the micro lens layer 118, the planarization layers 117 and 115, the color filter layer 116, the first substrate 101, and the interlayer insulation film 104. In this way, the configuration as illustrated in FIG. 1 is obtained. The semiconductor substrate 404, the main face 405, the back-side face 406, and the thickness D4 in FIG. 6 correspond to the second substrate 121, the main face 122, the back-side face 123, and the thickness D2 in FIG. 1 respectively.

There is no change in the thicknesses D4 and D2, however, it is also possible to make the semiconductor substrate 404 thinner so that the thickness D2 may be smaller than the thickness D4. Through the thinning, the number of manufacturing steps increases, but it is possible to reduce the size of the solid-state imaging apparatus.

As described above, etching to expose the pad is performed from the back-side face 408 side of the thinned semiconductor substrate 407, so that the requisite time for etching for pad formation can be shortened. The pad 313 can be formed by the same step as the wiring of the wiring layer 109, thus man-hours can be reduced. As in the present exemplary embodiment, it is desirable for the pad 313 to be formed of a metal whose main component is aluminum in order to reduce the connection resistance with the external terminal. At the time of etching, the pad 313 can function as an etching stopper.

The manufacturing method of the present exemplary embodiment of the present invention is not limited to the above-described steps but allows a change in the order of steps. The manufacturing order of the first member 308 and the second member 309 can be set as appropriate. Further, it is also possible to purchase the first member 308 and the second member 309 and bond them to each other. It is also possible to apply silicon-on-insulator (SOI) substrates to the semiconductor substrates 401 and 402.

Figure 7A:
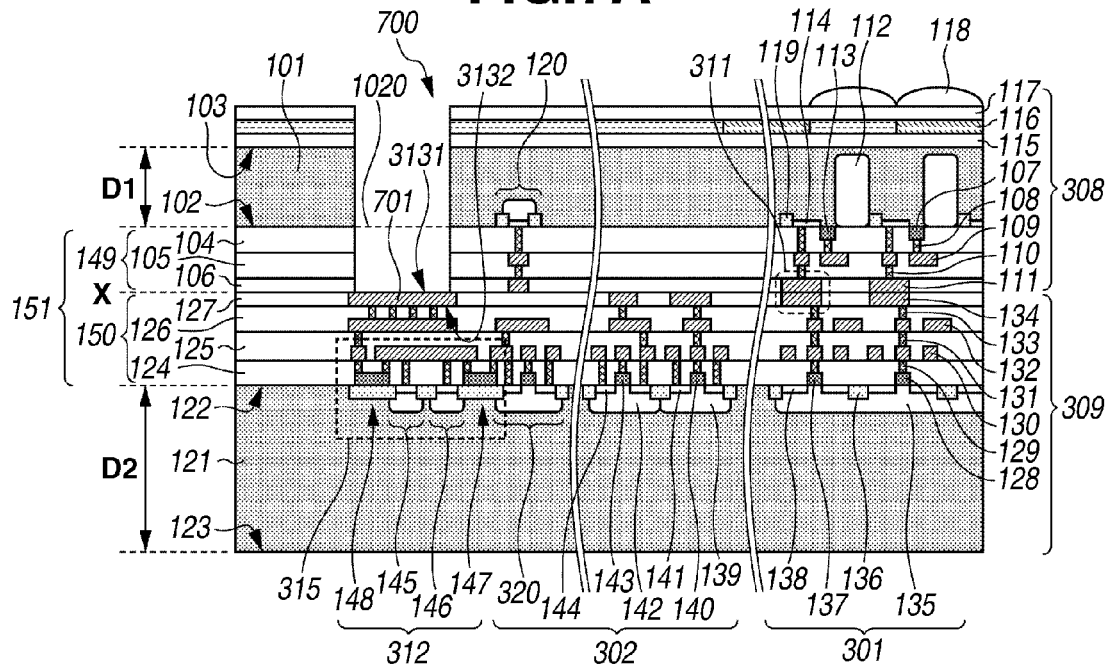
FIG. 7A is a schematic sectional view of a solid-state imaging apparatus according to a second exemplary embodiment.
Figure 7B:
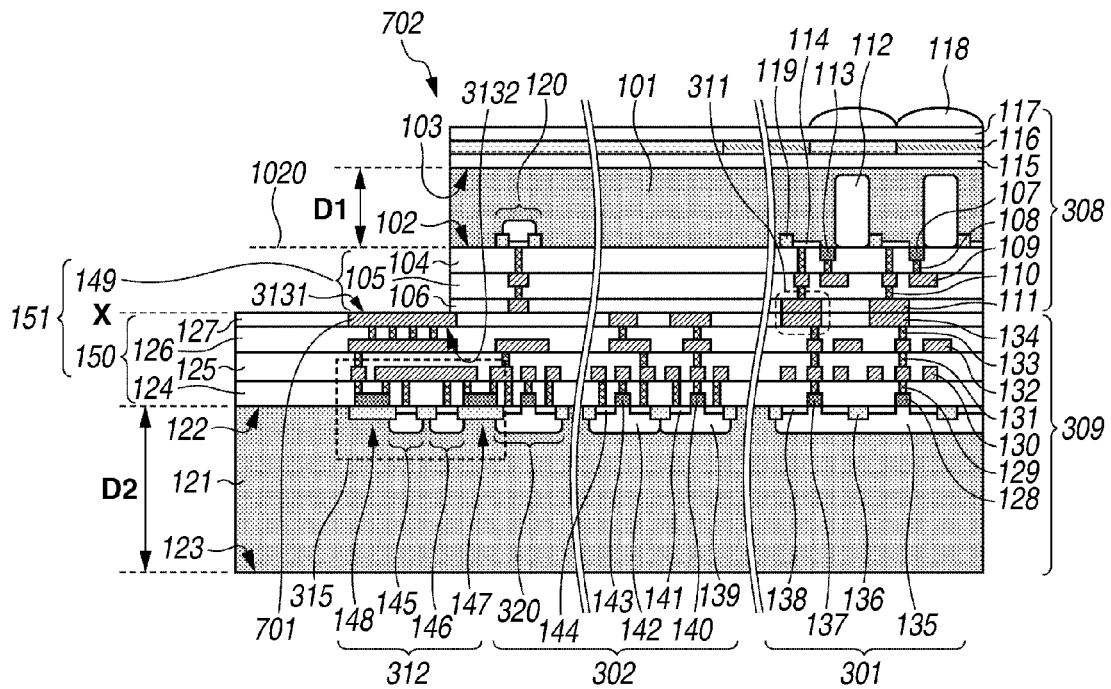
FIG. 7B is a schematic sectional view of the solid-state imaging apparatus according to the second exemplary embodiment.

A second exemplary embodiment of the present invention will be described with reference to FIGS. 7A and 7B. FIGS. 7A and 7B are schematic sectional views of a solid-state imaging apparatus, each corresponding to FIG. 1. In FIGS. 7A and 7B, the components that are similar to those in FIG. 1 are indicated by the same reference numerals, and a description thereof will be omitted.

The present exemplary embodiment differs from the first exemplary embodiment in the configuration of an opening 700 and of a pad 701 in FIG. 7A and in the configuration of an opening 702 and of the pad 701 in FIG. 7B. In the present exemplary embodiment, there are provided the opening 700 and the opening 702 that are deeper than that of the first exemplary embodiment, and there is provided the pad 701 that is more close to the main face 122 of the second member 309 than in the first exemplary embodiment. In this way, the pad may be arranged at any position so long as it is positioned on the first member 308 side than the main face 122 of the second member 309 and between the hypothetical plane 1020 and the main face 122.

However, by arranging the pad in close proximity to the second member 309 as in the present exemplary embodiment, the connection resistance from the pad 701 to the protection diode circuit 315 can be reduced as compared with the first exemplary embodiment. As in the first exemplary embodiment, in the present exemplary embodiment, the wiring structure 151 has five wiring layers. However, the pad 701 is arranged in the same layer as the wiring layer 134 which is the third layer as counted from the hypothetical plane 1020 side. In this way, it is desirable to arranged the pad 701 in the wiring layer (wiring layer 134, 132, or 130) more spaced apart from the hypothetical plane 1020 than the wiring layers (the wiring layers 109 and 111) on the hypothetical plane 1020 side.

More specifically, when the number N of wiring layers is an odd number, it is desirable to arrange the pad 701 in the same layer as the ((N+1)/2)-th to N-th wiring layer as counted from the hypothetical plane 1020 side. When the number N of wiring layers is an even number, it is desirable to arrange the pad 313 in the same layer as the (1+(N/2))-th to N-th wiring layer as counted from the hypothetical plane 1020 side.

In FIG. 7B, the shape of the opening 702 is different from that of the opening 100 of the first exemplary embodiment and that of the opening 700 in FIG. 7A. As illustrated in FIG. 7B, an unnecessary interlayer insulation film and semiconductor substrate situated on the outer side of the pad part of the first member 308 may be removed. Further, by previously making the first member 308 to be prepared smaller than the second member 309, or by deviating the end faces of the first member 308 and the second member 309 from each other, a part or all of the step of etching the first member 308 to provide the opening 702 can be omitted.

While the opening 702 is open toward the device end portion, from the viewpoint of suppressing intrusion of water, etc. into the pad part, it is desirable to provide, as illustrated in FIG. 7A, a through-hole in the first substrate 101 so that the opening 700 may become a space surrounded by the first substrate 101.

The pad 701 is arranged in the same layer as the wiring layer 134 of the second member 309. Here, the expression "the same layer" means a layer formed by the same process or a layer whose height from the main face is the same. The pad 701 is included in the same layer as the wiring layer 134, and is formed by the same process. Thus, it is desirable for the wiring layer 134 to be wiring whose main component is aluminum. In the present exemplary embodiment, there is adopted the wiring whose main component is copper as in the first exemplary embodiment, it is more desirable for the wiring layer 134 to be wiring whose main component is aluminum since it is the same layer as the pad 701. In this case, the connection portion 311 may be bonded by micro bumping or the like.

Figure 8A:
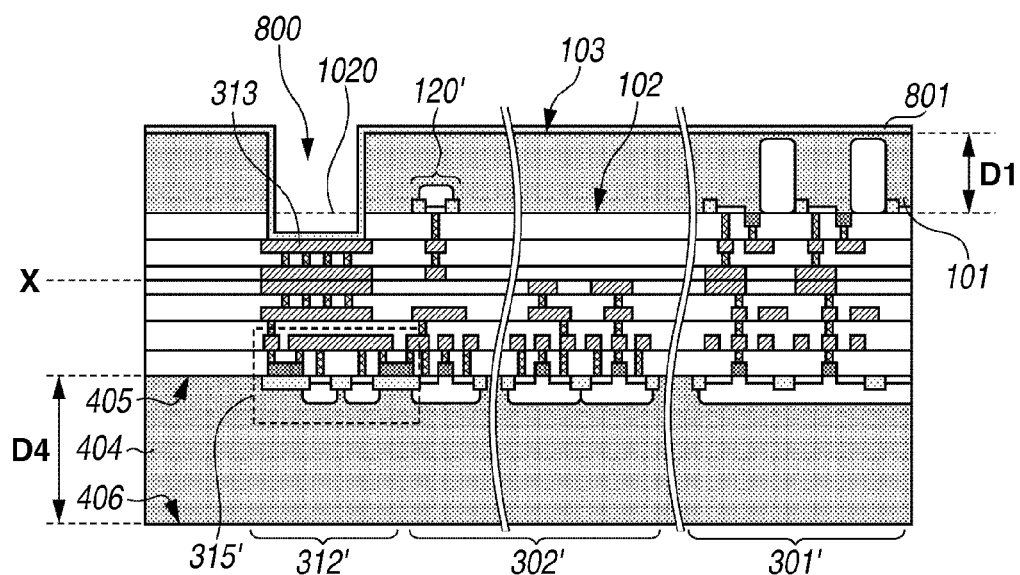
FIG. 8A is a schematic sectional view illustrating a solid-state imaging apparatus according to a third exemplary embodiment, and a manufacturing method of the same.
Figure 8B:
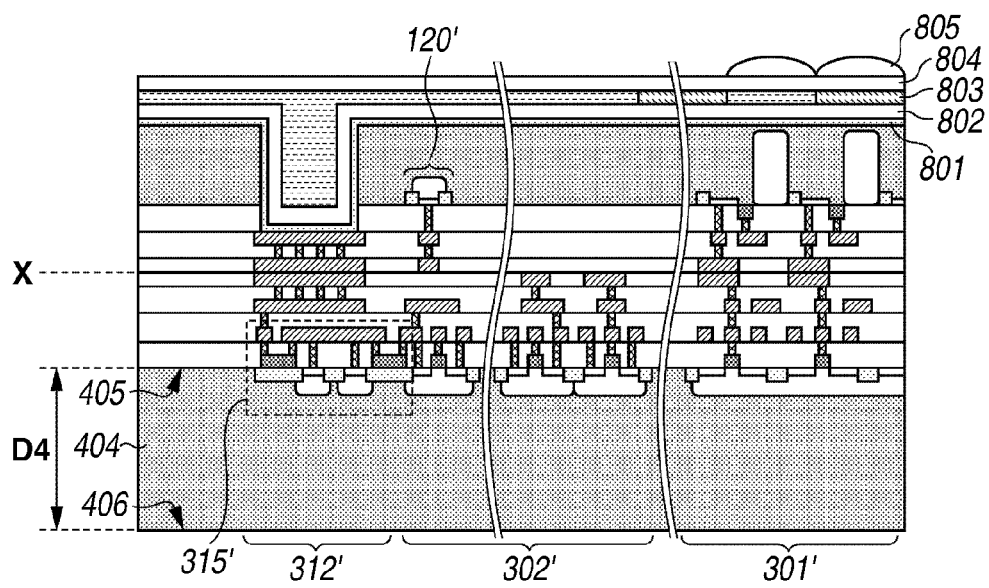
FIG. 8B is a schematic sectional view illustrating a solid-state imaging apparatus according to a third exemplary embodiment, and a manufacturing method of the same.
Figure 8C:
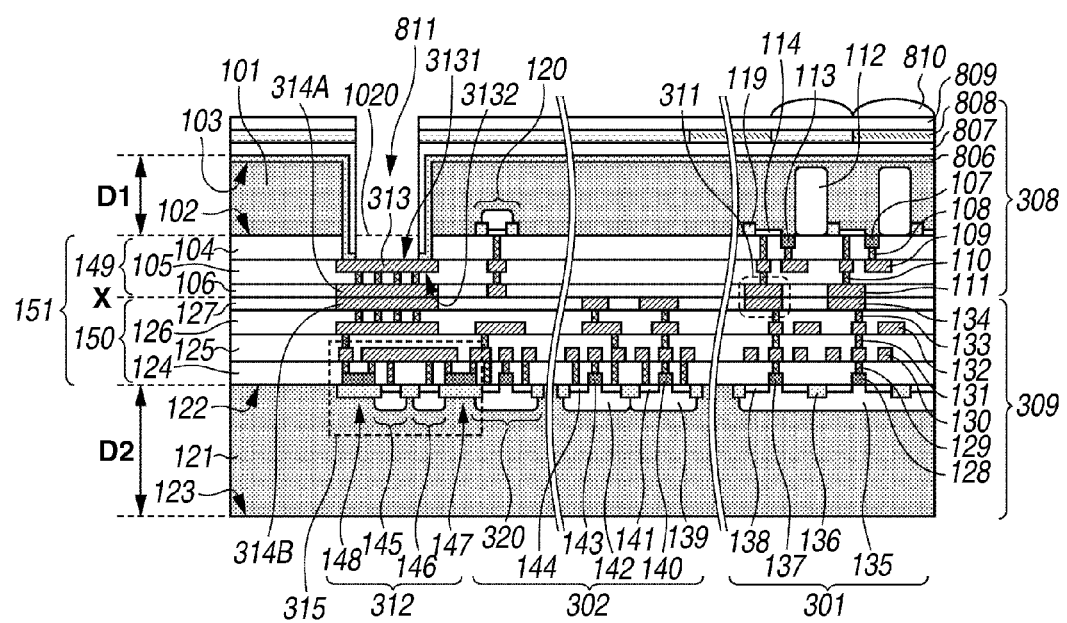
FIG. 8C is a schematic sectional view illustrating a solid-state imaging apparatus according to a third exemplary embodiment, and a manufacturing method of the same.

A third exemplary embodiment of the present invention will be described with reference to FIGS. 8A through 8C. FIG. 8C is a schematic sectional view of a solid-state imaging apparatus according to the present exemplary embodiment, and corresponds to FIG. 1. FIGS. 8A and 8B are schematic sectional views illustrating a manufacturing method of the solid-state imaging apparatus of the present exemplary embodiment, and correspond to FIGS. 6A and 6B respectively. In FIGS. 8A through 8C, the components that are similar to those in FIGS. 1, 6A and 6B are indicated by the same reference numerals, and a description thereof will be omitted.

The present exemplary embodiment differs from the first exemplary embodiment in the configuration of an opening 811 and of a protective film 806 illustrated in FIG. 8C. The protective film 806 of the present exemplary embodiment covers a side wall (side face) of the first substrate 101 having the opening 811. Further, the protective film 806 extends from the side wall to cover a peripheral edge of a first face 3131 of the pad 313. Due to the provision of the protective film 806, it is possible to reduce intrusion of water into the interior of the device from the opening 811.

When an external terminal for connection with the pad 313 is brought into contact with a conductive member such as the first substrate 101, leakage may occur. The protective film 806 prevents the external terminal from coming into contact with the conductive member, and suppresses occurrence of leakage. Further, the protective film 806 of the present exemplary embodiment is also arranged on an incident surface of the photoelectric conversion portion of the pixel part 301 (i.e., on the back-side face 103 of the first substrate 101), and can also function as an antireflection film.

By providing the protective film 806, the configuration of the opening differs from that of the first exemplary embodiment. Further, the configuration of a planarization layer 807, a color filter layer 808, a planarization layer 809, and a micro lens layer 810 can also be changed into a configuration different from that of the first exemplary embodiment.

The manufacturing method of the present exemplary embodiment will be described with reference to FIGS. 8A and 8B. The up to the process illustrated in FIG. 6A, the method is similar to that of the first exemplary embodiment, so a description thereof will be omitted. The opening 800 is formed in the semiconductor substrate 407 in FIG. 6A by photolithography and etching technique, so that the first substrate 101 is formed. The opening 800 is formed so as to expose the pad 313. Then, a silicon nitride film 801 that can serve as a protective film is formed by the plasma chemical vapor deposition (CVD) method or the like to cover the side face of the opening 800 and to cover the back-side face 103 of the first substrate 101, so that the configuration as illustrated in FIG. 8A is obtained.

Then, a planarization layer 802, a color filter layer 803, a planarization layer 804, and a micro lens layer 805 are formed in this order so as to cover the silicon nitride film 801. The materials and the manufacturing method are the same as those of the first exemplary embodiment. And then, the opening 811 is formed. The opening 811 extends through the silicon nitride film 801, the planarization layer 802, the color filter layer 803, the planarization layer 804, and the micro lens layer 805. Further, a part of the first face 3131 of the pad 313 is exposed so as to cause the protective film 806 to cover solely the peripheral edge of the first face 3131.

The silicon nitride film 801, the planarization layer 802, the color filter layer 803, the planarization layer 804, and the micro lens layer 805 are respectively turned into the protective film 806, the planarization layer 807, the color filter layer 808, the planarization layer 809, and the micro lens layer 810. Thus, the solid-state imaging apparatus as illustrated in FIG. 8C is produced.

Figure 9:
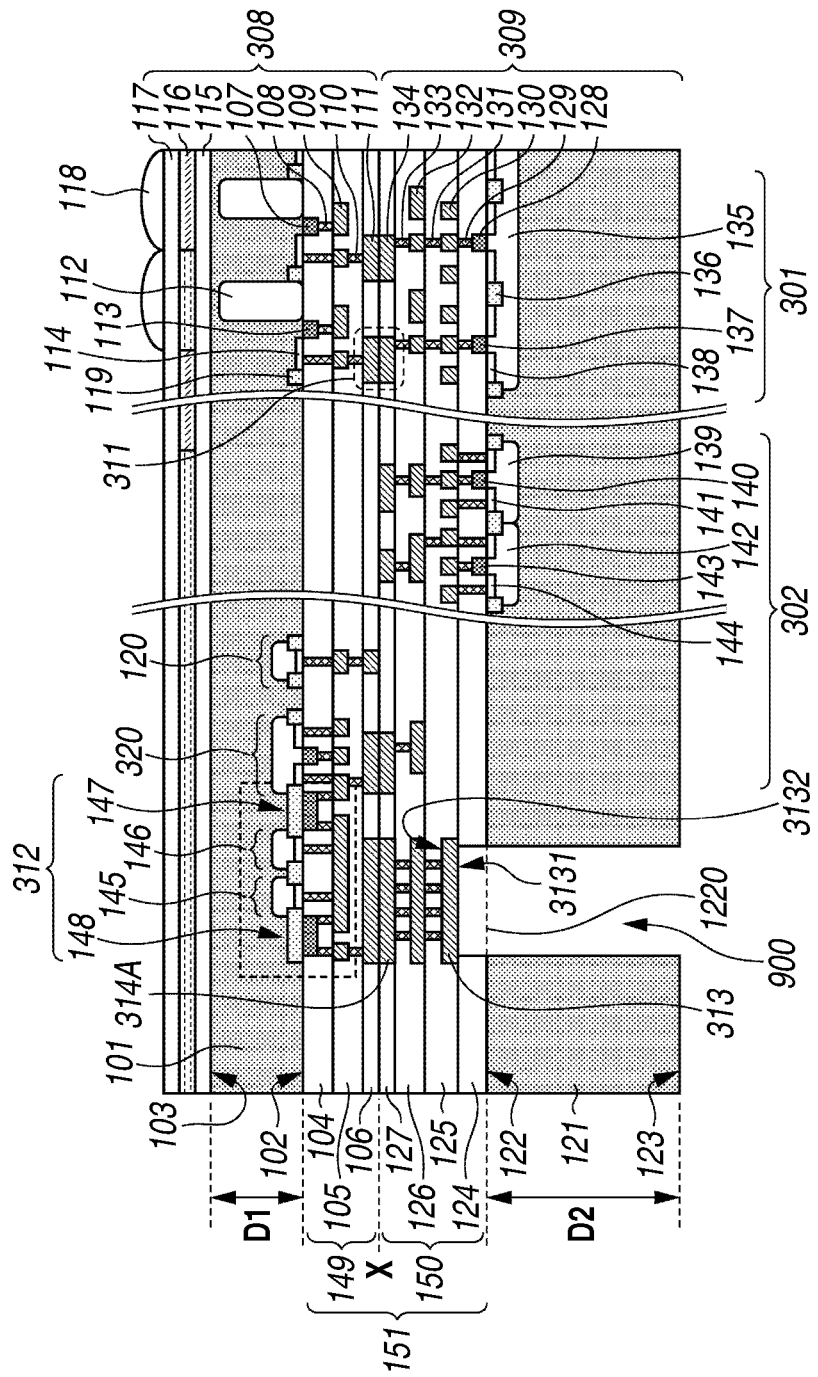
FIG. 9 is a schematic sectional view of a solid-state imaging apparatus according to a fourth exemplary embodiment.

A fourth exemplary embodiment of the present invention will be described with reference to FIG. 9. FIG. 9 is a schematic sectional view of a solid-state imaging apparatus according to the present exemplary embodiment, and corresponds to FIG. 1. In FIG. 9, the components that are similar to those in FIGS. 1, 6A and 6B are indicated by the same reference numerals, and a description thereof will be omitted.

The present exemplary embodiment differs from the first exemplary embodiment in that an opening 900 is provided not in the first substrate 101 but in the second substrate 121, and that a protection diode circuit 315 is arranged not on the second substrate 121 but on the first substrate 101. In the following, the above features will be described.

The pad 313 of the solid-state imaging apparatus for signal exchange with the exterior is arranged in the lower portion of the front-side face of the first substrate 101, which is the main face 102 of the first member 308, and the opening 900 is provided on the second member 309 side. The pad 313 has the first face 3131 and the second face 3132, which is an opposite side face of the first face 3131. The first face 3131 of the pad 313 is exposed on the second substrate 121 side, and an external terminal is connected to the first face 3131. More specifically, both the first face 3131 and the second face 3132 of the pad 313 are situated on the second substrate 121 side than the main face 102.

Here, an extension of the main face 122 of the second substrate 121 will be considered as a hypothetical plane 1220. The hypothetical plane 1220, which is a hypothetical extension of the main face 122, is parallel to the main face 122, and includes the main face 122. Thus, in FIG. 9, the hypothetical plane 1220 extends across the opening 900. The pad 313 is situated between the main face 122 of the first substrate 101 and the hypothetical plane 1220. More specifically, the first face 3131 of the pad 313 is situated between the hypothetical plane 1220 and the second face 3132, and the second face 3132 of the pad 313 is situated between the first face 3131 and the main face 102 of the first substrate 101.

In the present exemplary embodiment, the pad 313 is arranged in the same layer as the wiring layer 130 which is the first layer of the five wiring layers as counted from the hypothetical plane 1220 side. The wiring layer 130 is constituted by wiring whose main component is aluminum, and the pad 313 also contains aluminum as the main component. The wiring layer 111 includes the connection portion 314A and the connection portion 311, and the wiring layer 134 includes the connection portion 314B and the connection portion 311. Each wiring layer is constituted by wiring whose main component is copper.

As in the second exemplary embodiment, the pad 313 is arranged in the wiring layer (wiring layer 134, 111, 109) more spaced apart from the hypothetical plane 1220 than the wiring layers on the hypothetical plane 1220 side (wiring layers 130 and 132), thus the connection resistance can be reduced. However, in the present exemplary embodiment also, the thickness D1 of the first substrate 101 is smaller than the thickness D2 of the second substrate 121. When the distance between the first face 3131 of the pad 313 and the back-side face 103 of the first substrate is extremely reduced, the mechanical strength of the pad part 312 is reduced. Thus, it is desirable to arrange the pad 313 in the same layer as the wiring layers (wiring layers 130, 132) on the hypothetical plane 1220 side to secure a sufficient distance between the first face 3131 of the pad 313 and the back-side face 103 of the first substrate 101.

The protection diode circuit 315 is arranged in the pad part 312 of the first member 308. Further, in the peripheral circuit part 302, a circuit element 320 constituting a certain part of the peripheral circuit is arranged on the first substrate 101, and the circuit element 320 is connected to another part of the peripheral circuit arranged on the second substrate 121 via the wiring structure 151. The wiring layer connecting the peripheral circuits arranged on both substrates includes at least the wirings layer 111 and the wiring layer 134 including the connection portions.

In the pad part 312, the pad 313 is connected to the protection diode circuit 315 via the contact layer 131 and the wiring layer 132 of the second wiring structure 150, the contact layer 133, and the wiring layer 134 (connection portion 314B), and further, via the wiring layer 111 (connection portion 314A) and the contact layer 110 of the first wiring structure 149, the wiring layer 109, the contact layer 108, and the gate electrode 107. The second face 3132 of the pad 313 is connected to the contact layer 131 at a plurality of positions.

In this way, when the protection diode circuit 315, which is a part of a semiconductor integrated circuit, is provided on the first substrate 101, it is possible to adopt a configuration in which the pad 313 is situated between the main face 102 and the hypothetical plane 1220 to form an electrical route from the second face 3132. According to this configuration, the electrical route between the pad 313 and the protection diode circuit 315, and further, between the pad 313 and the peripheral circuit can be shortened. In the present exemplary embodiment also, it is desirable for the distance between the pad 313 and the first substrate 101 to be not more than 5 micrometer.

In the present exemplary embodiment, connection is formed from the protection diode circuit 315 to the circuit element 320, which is a part of the peripheral circuit, and the circuit element 320 is connected to another part of the peripheral circuit arranged on the second substrate 121 via the wiring structure 151. However, the part to be connected to the protection diode circuit 315 is not limited to the circuit element 320 of the peripheral circuit. For example, the protection diode circuit 315 can be connected to the pixel circuit (e.g., transfer transistor) arranged on the first substrate 101, and the pixel circuit and the peripheral circuit arranged on the second substrate 121 can be connected to each other via the wiring structure 151.

Further, the protection diode circuit 315 can be directly connected to the peripheral circuit arranged on the second substrate 121 via the wiring structure 151 without passing through the peripheral circuit arranged on the first substrate 101. Further, as in the first exemplary embodiment, the solid-state imaging apparatus of the present exemplary embodiment can adopt a bonding wire as the external terminal. However, flip chip bonding can also be adopted.

By arranging the external terminal on the back-side face 123 of the second substrate 121, deterioration or damage of the external terminal and intrusion of water from the periphery of the pad can be suppressed. The opening 900 can be formed by performing etching on the second substrate 121 and a part of the second wiring structure 150. As in the case in FIG. 7B described in the second exemplary embodiment, in the present exemplary embodiment also, it is possible to eliminate the end portion of the second substrate 121. Further, as in the third exemplary embodiment, it is also possible to provide a protective film.

As described above, according to the present exemplary embodiment, a solid-state imaging apparatus with high reliability in terms of the connection between the pad and the circuit can be provided.

As an application example of the solid-state imaging apparatus of the above-described exemplary embodiments, an imaging system with a solid-state imaging apparatus incorporated therein will be described. The imaging system is not limited to an apparatus such as a camera mainly intended for photographing, and also includes an apparatus provided with a photographing function as an additional feature (e.g., a personal computer or a mobile terminal). For example, a camera includes a solid-state imaging apparatus according to the present invention and a processing part for processing a signal output from the solid-state imaging apparatus. The processing part may include, for example, an analog-to-digital (A/D) converter and a processor configured to process digital data output from the A/D converter. A signal to be processed is input to the processing part via an external terminal such as a bonding wire connected to the pad of the solid-state imaging apparatus.

As described above, according to the present invention, a solid-state imaging apparatus with high reliability in terms of the connection between the pad and the circuit can be provided. Further, the present invention can facilitate the connection between the pad and the circuit.

The present invention is not limited to the configuration as described in the present specification, and can be modified to adopt, for example, the conductive type circuit and a reverse conductive type circuit. Further, while in the above-described configuration the connection portion is formed with the wiring of the wiring layer, it may also include a via or a micro bump so long as conduction may be securely formed. Further, the features of the above-described exemplary embodiments can be combined with each other as appropriate.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

REFERENCE SIGNS LIST

301 pixel part
302 peripheral circuit part
308 first member
309 second member
149 first wiring structure
150 second wiring structure
312 pad part
313 pad
101 first substrate
121 second substrate
100 opening
X connection face

The invention claimed is:

1. A manufacturing method of a solid-state imaging apparatus comprising:
    bonding a first member and a second member, the first member having a first semiconductor substrate including a photoelectric conversion element and having a first wiring structure arranged on the first semiconductor substrate and the second member having a second semiconductor substrate including a transistor and having a second wiring structure arranged on the second semiconductor substrate,
    wherein the first member and the second member are bonded so that a pad for connection with an external terminal, the first wiring structure and the second wiring structure are positioned between the first semiconductor substrate and the second semiconductor substrate;
    thinning the first semiconductor substrate after the bonding of the first member and the second member, so that a thickness of the first semiconductor substrate is smaller than a thickness of the second semiconductor substrate;
    forming a micro lens layer on the first semiconductor substrate after the thinning of the first semiconductor substrate; and,
    exposing the pad on a side of the first semiconductor substrate after the forming of the micro lens layer,
    wherein the pad is connected to a circuit provided in the second member before the thinning of the first semiconductor substrate.

2. The manufacturing method of the solid-state imaging apparatus according to claim 1, wherein after the thinning of the first semiconductor substrate, dry etching is performed to remove a part above the pad in the first semiconductor substrate.

3. The manufacturing method of the solid-state imaging apparatus according to claim 1, further comprising:
    forming a first opening in the first semiconductor substrate after the thinning of the first semiconductor substrate;
    forming a film in the first opening to cover the first semiconductor substrate, and
    forming a second opening in the film to expose the pad through the first opening and the second opening.

4. The manufacturing method of the solid-state imaging apparatus according to claim 1,
    wherein the pad is arranged in the same layer as a wiring layer of the first wiring structure, or the second wiring structure.

5. The manufacturing method of the solid-state imaging apparatus according to claim 1, further comprising thinning the second semiconductor substrate.

6. The manufacturing method of the solid-state imaging apparatus according to claim 4, wherein after the bonding of the first member and the second member, a plurality of wiring layers are positioned between the same layer and the first semiconductor substrate.

7. The manufacturing method of the solid-state imaging apparatus according to claim 4, wherein after the bonding of the first member and the second member, a plurality of wiring layers are positioned between the same layer and the second semiconductor substrate.

8. The manufacturing method of the solid-state imaging apparatus according to claim 1, wherein a main component of the pad is aluminum.

9. The manufacturing method of the solid-state imaging apparatus according to claim 8, wherein the second wiring structure includes a wiring whose main component is copper.

10. The manufacturing method of the solid-state imaging apparatus according to claim 1, wherein before the thinning of the first semiconductor substrate, the pad is connected to the circuit of the second member through a wiring which overlaps the pad between the pad and the second semiconductor substrate.

11. The manufacturing method of the solid-state imaging apparatus according to claim 1, wherein before the thinning of the first semiconductor substrate, the pad is connected to the circuit of the second member through a plurality of vias in one contact layer which overlaps the pad between the pad and the second semiconductor substrate.

12. The manufacturing method of the solid-state imaging apparatus according to claim 1, wherein before the bonding of the first member and the second member, the pad is connected to the second wiring structure.

13. The manufacturing method of the solid-state imaging apparatus according to claim 1, wherein before the bonding of the first member and the second member, the pad is connected to the first wiring structure.

14. The manufacturing method of the solid-state imaging apparatus according to claim 1, wherein before the exposing of the pad, a conduction between a wiring of the first wiring structure and a wiring of the second wiring structure is formed.

15. The manufacturing method of the solid-state imaging apparatus according to claim 1, wherein before the thinning of the first semiconductor substrate, a conduction between a wiring of the first wiring structure and a wiring of the second wiring structure is formed.

16. The manufacturing method of the solid-state imaging apparatus according to claim 1, wherein the circuit of the second member is a protective diode circuit.

17. The manufacturing method of the solid-state imaging apparatus according to claim 1,
wherein first semiconductor substrate includes a transfer transistor for transferring a charge in the photoelectric conversion element, and
the second member includes a signal processing circuit for processing a signal based on the charge.

18. The manufacturing method of the solid-state imaging apparatus according to claim 1,
wherein the first semiconductor substrate includes an amplification transistor for outputting a signal based on a charge in the photoelectric conversion element.

19. The manufacturing method of the solid-state imaging apparatus according to claim 1,
wherein the second member includes a control circuit for driving a circuit provided in the first member.

20. An imaging system comprising:
a solid-state imaging apparatus manufactured by the manufacturing method according to claim 1; and
a processing part for processing a signal output from the solid-state imaging apparatus.

21. A manufacturing method of a solid-state imaging apparatus comprising:
bonding a first member and a second member, the first member having a first semiconductor substrate including a photoelectric conversion element and having a first wiring structure arranged on the first semiconductor substrate, and the second member having a second semiconductor substrate including a transistor and having a second wiring structure arranged on the second semiconductor substrate,
wherein the first member and the second member are bonded so that a pad for connection with an external terminal, the first wiring structure and the second wiring structure are positioned between the first semiconductor substrate and the second semiconductor substrate;
thinning the first semiconductor substrate after the bonding of the first member and the second member, so that a thickness of the first semiconductor substrate is smaller than a thickness of the second semiconductor substrate;
forming a micro lens layer on the first semiconductor substrate after the thinning of the first semiconductor substrate; and
forming an opening, through which the external terminal is to be connected with the pad, in the first semiconductor substrate by removing a part of the first semiconductor substrate after the forming of the micro lens layer.

22. The manufacturing method of the solid-state imaging apparatus according to claim 21, wherein the pad is connected to a circuit provided in the second member before the forming of the opening.

23. The manufacturing method of the solid-state imaging apparatus according to claim 21, wherein the pad is connected to a circuit provided in the second member before the forming of the micro lens layer.

24. The manufacturing method of the solid-state imaging apparatus according to claim 21, wherein the pad is arranged in the same layer as a wiring layer of the first wiring structure or the second wiring structure.

25. The manufacturing method of the solid-state imaging apparatus according to claim 21, further comprising thinning the second semiconductor substrate.

26. The manufacturing method of the solid-state imaging apparatus according to claim 24, wherein after the bonding of the first member and the second member, a plurality of wiring layers are positioned between the same layer and the first semiconductor substrate.

27. The manufacturing method of the solid-state imaging apparatus according to claim 24, wherein after the bonding of the first member and the second member, a plurality of wiring layers are positioned between the same layer and the second semiconductor substrate.

28. The manufacturing method of the solid-state imaging apparatus according to claim 21, wherein a main component of the pad is aluminum.

29. The manufacturing method of the solid-state imaging apparatus according to claim 28, wherein the second wiring structure includes a wiring whose main component is copper.

30. The manufacturing method of the solid-state imaging apparatus according to claim 22, wherein before the forming of the opening, the pad is connected to the circuit of the second member through a wiring which overlaps the pad between the pad and the second semiconductor substrate.

31. The manufacturing method of the solid-state imaging apparatus according to claim 22, wherein before the forming of the opening, the pad is connected to the circuit of the second member through a plurality of vias in one contact layer which overlaps the pad between the pad and the second semiconductor substrate.

32. The manufacturing method of the solid-state imaging apparatus according to claim 21, wherein before the bonding of the first member and the second member, the pad is connected to the second wiring structure.

33. The manufacturing method of the solid-state imaging apparatus according to claim 21, wherein before the bonding of the first member and the second member, the pad is connected to the first wiring structure.

34. The manufacturing method of the solid-state imaging apparatus according to claim 21, wherein before the forming of the opening, a conduction between a wiring of the first wiring structure and a wiring of the second wiring structure is formed.

35. The manufacturing method of the solid-state imaging apparatus according to claim 21, wherein before the thinning of the first semiconductor substrate, a conduction between a wiring of the first wiring structure and a wiring of the second wiring structure is formed.

36. The manufacturing method of the solid-state imaging apparatus according to claim 22, wherein the circuit of the second member is a protective diode circuit.

37. The manufacturing method of the solid-state imaging apparatus according to claim 21, wherein first semiconductor substrate includes a transfer transistor for transferring a charge in the photoelectric conversion element, and the second member includes a signal processing circuit for processing a signal based on the charge.

38. The manufacturing method of the solid-state imaging apparatus according to claim 21, wherein the first semiconductor substrate includes an amplification transistor for outputting a signal based on a charge in the photoelectric conversion element.

39. The manufacturing method of the solid-state imaging apparatus according to claim 21, wherein the second member includes a control circuit for driving a circuit provided in the first member.

40. An imaging system comprising:
  a solid-state imaging apparatus manufactured by the manufacturing method according to claim 21; and
  a processing part for processing a signal output from the solid-state imaging apparatus.

* * * * *